US012720835B2

(12) United States Patent
Bayati et al.

(10) Patent No.: US 12,720,835 B2
(45) Date of Patent: Aug. 25, 2026

(54) GATE CUTS WITH SELF-FORMING POLYMER LAYER

(71) Applicant: Intel Corporation, Santa Clara, CA (US)

(72) Inventors: Reza Bayati, Portland, OR (US); Matthew J. Prince, Portland, OR (US); Alison V. Davis, Portland, OR (US); Chun C. Kuo, Hillsboro, OR (US); Andrew Arnold, Hillsboro, OR (US); Ramy Ghostine, Portland, OR (US); Li Huey Tan, Hillsboro, OR (US)

(73) Assignee: INTEL CORPORATION, Santa Clara, CA (US)

( * ) Notice: Subject to any disclaimer, the term of this patent is extended or adjusted under 35 U.S.C. 154(b) by 101 days.

(21) Appl. No.: 17/952,695

(22) Filed: Sep. 26, 2022

(65) Prior Publication Data

US 2024/0105452 A1 Mar. 28, 2024

(51) Int. Cl.

| | |
|---|---|
| ***H10D 64/01*** | (2025.01) |
| ***H10D 30/01*** | (2025.01) |
| ***H10D 30/43*** | (2025.01) |
| ***H10D 30/67*** | (2025.01) |
| ***H10D 62/10*** | (2025.01) |
| ***H10D 84/01*** | (2026.01) |
| ***H10D 84/03*** | (2025.01) |
| ***H10D 84/85*** | (2025.01) |

(52) U.S. Cl.

CPC ..... *H10D 64/01326* (2026.01); *H10D 30/014* (2025.01); *H10D 30/43* (2025.01); *H10D 30/6735* (2025.01); *H10D 62/121* (2025.01); *H10D 64/017* (2025.01); *H10D 84/0167* (2025.01); *H10D 84/017* (2025.01); *H10D 84/0188* (2025.01); *H10D 84/038* (2025.01); *H10D 84/85* (2025.01)

(58) Field of Classification Search

None

See application file for complete search history.

(56) References Cited

U.S. PATENT DOCUMENTS

| | | | | |
|---|---|---|---|---|
| 2017/0012124 | A1* | 1/2017 | Glass | H10D 30/797 |
| 2019/0067277 | A1* | 2/2019 | Tsai | H10D 84/0151 |
| 2021/0376101 | A1* | 12/2021 | Wang | H10D 64/517 |

* cited by examiner

*Primary Examiner* — Christine S. Kim
*Assistant Examiner* — Cole Leon Lindsey
(74) *Attorney, Agent, or Firm* — Arcane Law PLLC

(57) ABSTRACT

Techniques are provided to form semiconductor devices that include one or more gate cuts having a layer of polymer material at edges of the gate cut. The polymer layer may be provided as a byproduct of the etching process used to form the gate cut recess through the gate structure, and can protect any exposed portions of the source or drain regions from certain subsequent processes. The gate structure may be interrupted between two transistors with a gate cut that extends through an entire thickness of the gate structure and includes a dielectric material to electrically isolate the portions of the gate structure on either side of the gate cut. The edges of the gate cut may be lined with a polymer layer that is also on any exposed portions of the source or drain regions that were exposed during the etching process used to form the gate cut recess.

20 Claims, 12 Drawing Sheets

GATE CUTS WITH SELF-FORMING POLYMER LAYER

FIELD OF THE DISCLOSURE

The present disclosure relates to integrated circuits, and more particularly, to metal gate cuts made in semiconductor devices.

BACKGROUND

As integrated circuits continue to scale downward in size, a number of challenges arise. For instance, reducing the size of memory and logic cells is becoming increasingly more difficult, as is reducing device spacing at the device layer. As transistors are packed more densely, the formation of certain device structures used to isolate adjacent transistors becomes challenging. Accordingly, there remain a number of non-trivial challenges with respect to forming semiconductor devices.

Figure 1A:
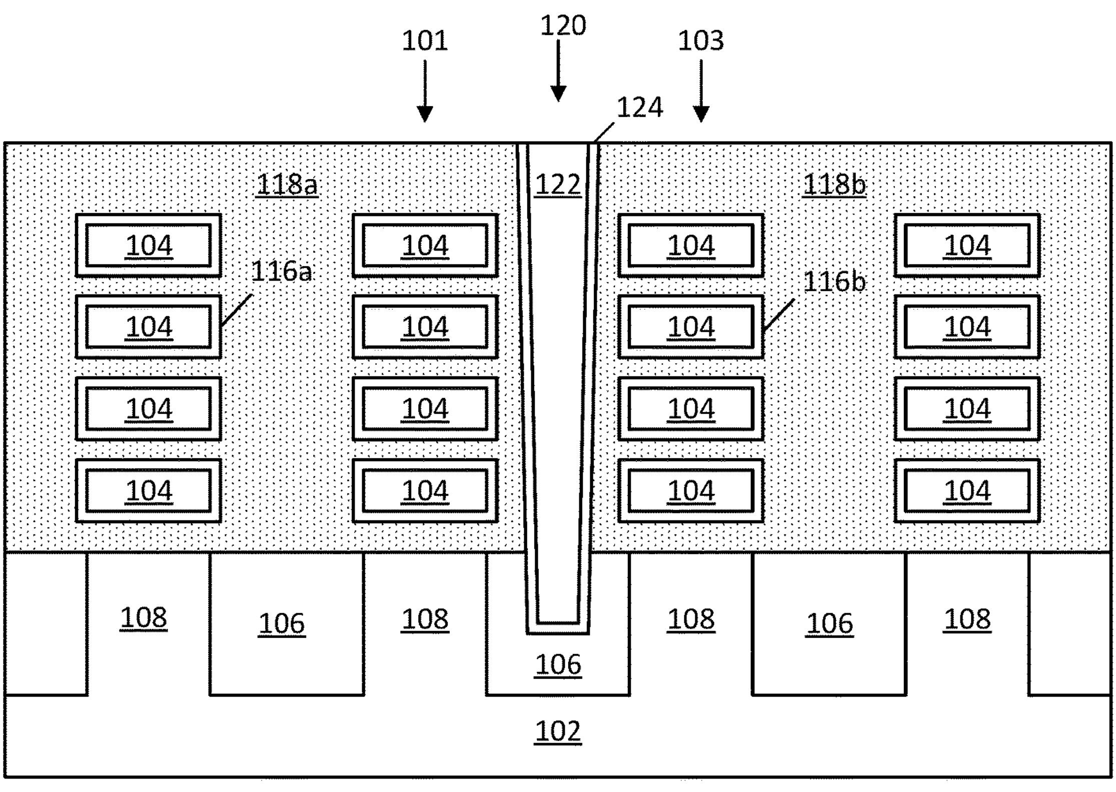
FIGS. 1A and 1B are cross-sectional views of some semiconductor devices that illustrate a gate cut between devices with a polymer layer between portions of the source or drain regions and the gate cut, in accordance with an embodiment of the present disclosure.

Although the following Detailed Description will proceed with reference being made to illustrative embodiments, many alternatives, modifications, and variations thereof will be apparent in light of this disclosure. As will be further appreciated, the figures are not necessarily drawn to scale or intended to limit the present disclosure to the specific configurations shown. For instance, while some figures generally indicate perfectly straight lines, right angles, and smooth surfaces, an actual implementation of an integrated circuit structure may have less than perfect straight lines, right angles (e.g., some features may have tapered sidewalls and/or rounded corners), and some features may have surface topology or otherwise be non-smooth, given real world limitations of the processing equipment and techniques used.

DETAILED DESCRIPTION

Techniques are provided herein to form semiconductor devices that include one or more gate cuts having a polymer layer at edges of the gate cut. The polymer layer may be provided as a byproduct of the etching process used to form the gate cut recess through the metal gate electrode, and can protect any exposed portions of the source or drain regions from any subsequent processing. The techniques can be used in any number of integrated circuit applications and are particularly useful with respect to device layer transistors, such as finFETs or gate-all-around transistors (e.g., ribbonFETs and nanowire FETs). In an example, a semiconductor device includes a gate structure around or otherwise on a semiconductor region. The semiconductor region can be, for example, a fin of semiconductor material that extends from a source region to a drain region, or one or more nanowires or nanoribbons or nanosheets of semiconductor material that extend from a source region to a drain region. The gate structure includes a gate dielectric (e.g., high-k gate dielectric material) and a gate electrode (e.g., conductive material such as workfunction material and/or gate fill metal). The gate structure may be interrupted, for example, between two transistors with a gate cut that extends through an entire thickness of the gate structure and includes a dielectric material to electrically isolate the portions of the gate structure on either side of the gate cut. The edges of the gate cut may be lined with a polymer layer that is also on any portions of the source or drain regions that were exposed during the etching process used to form the gate cut recess. The polymer layer may be formed during the etching process itself, so as to be self-forming, and may beneficially be used to protect the source or drain regions from damage. Numerous variations and embodiments will be apparent in light of this disclosure.

General Overview

As previously noted above, there remain a number of non-trivial challenges with respect to integrated circuit fabrication. In more detail, as devices become smaller and more densely packed, many structures become more challenging to fabricate as critical dimensions (CD) of the structures push the limits of current fabrication technology. Example structures like gate cuts are used in integrated circuit design to isolate gate structures from one another. One possible way to form gate cuts is to use a gate patterning scheme that uses the poly-cut flow, where the gate cut is formed prior to formation of the final metal gate. Another approach might be to use a gate patterning scheme that uses the metal gate cut flow. Such approaches generally etch a trench or other recess through a thickness of the poly or metal gate structure and fill the trench with a dielectric material. While gate cuts formed after the formation of the metal gate structures may have some benefits over gate cuts formed during poly-cut flow, the process of forming the recess through the metal gate may also expose portions of the source or drain regions due to the densely packed structures. This can cause the source or drain regions to be damaged or otherwise at least partially etched out during subsequent processing used to remove byproducts from the device (e.g., cleaning, ashing, or other strong and/or prolonged processes that can damage or otherwise impinge on exposed source and drain regions).

Thus, and in accordance with an embodiment of the present disclosure, techniques are provided herein to protect the source and drain regions from damage by using a polymer layer. In an example, the polymer layer is self-forming during the etch process used to form the gate cut recess. In some such cases, the etchant gases used to etch through the metal gate electrode when forming the gate cut recess create a polymer byproduct that coats the exposed surfaces within the recess. If the source or drain regions are exposed during the etching process, the polymer layer will also form over the exposed portions of the source or drain regions. According to some embodiments, a curing process may be performed to harden this polymer layer and retain it at least over the source or drain regions to protect them from being etched or damaged by subsequent processes. The polymer layer may include, for example, boron and is cured in an oxygen-containing environment such that the final polymer layer along exposed source and drain regions contains both boron and oxygen or both boron and nitrogen.

According to an embodiment, an integrated circuit includes a first semiconductor device having a first semiconductor region extending in a first direction from a first source region to a first drain region, and a first gate structure extending in a second direction over the first semiconductor region, a second semiconductor device having a second semiconductor region extending in the first direction from a second source region to a second drain region, and a second gate structure extending in the second direction over the second semiconductor region, and a gate cut between and separating the first gate structure and the second gate structure. The gate cut includes a dielectric material on a layer comprising polymer material. The layer comprising polymer material is along at least a portion of a sidewall of the gate cut. The first and second semiconductor regions may be fins of semiconductor material, or may each include one or more semiconductor nanoribbons or nanowires or nanosheets extending lengthwise in the first direction. A portion of the polymer layer contacts at least one of the first source region, the first drain region, the second source region, and the second drain region. Note that the polymer layer is described as being part of the gate cut structure, but that polymer layer may also more generally be considered to be an independent layer between the gate cut (e.g., dielectric material) and the source and drain regions (e.g., doped semiconductor material). To this end, the phrasing that the gate cut includes a polymer layer is not to be interpreted to exclude a polymer layer that is independent of the gate cut and between the gate cut and source/drain regions.

According to an embodiment, an integrated circuit includes one or more semiconductor regions extending in a first direction between corresponding source or drain regions, a gate structure extending in a second direction over the one or more semiconductor regions, and a gate cut extending in a third direction through an entire thickness of the gate structure. The gate cut includes a polymer layer at edges of the gate cut and a dielectric material on the polymer layer. A portion of the polymer layer contacts at least one of the corresponding source or drain regions.

According to another embodiment, a method of forming an integrated circuit includes forming a first fin comprising first semiconductor material and a second fin comprising second semiconductor material, the first and second fins extending above a substrate and each extending in a first direction; forming a gate structure extending over the first semiconductor material and the second semiconductor material in a second direction different from the first direction; forming a recess through the gate structure between the first fin and the second fin, wherein forming the recess comprises forming a polymer layer on sidewalls of the recess; exposing the polymer layer to oxygen for a given period of time to harden the polymer layer; and forming a dielectric material within a remaining volume of the recess.

The techniques can be used with any type of non-planar transistors, including finFETs (sometimes called tri-gate transistors), nanowire and nanoribbon transistors (sometimes called gate-all-around transistors), or forksheet transistors, to name a few examples. The source and drain regions can be, for example, doped portions of a given fin or substrate, or epitaxial regions that are deposited during an etch-and-replace source/drain forming process. The dopant-type in the source and drain regions will depend on the polarity of the corresponding transistor. The gate structure can be implemented with a gate-first process or a gate-last process (sometimes called a replacement metal gate, or RMG, process). Any number of semiconductor materials can be used in forming the transistors, such as group IV materials (e.g., silicon, germanium, silicon germanium) or group III-V materials (e.g., gallium arsenide, indium gallium arsenide).

Use of the techniques and structures provided herein may be detectable using tools such as electron microscopy including scanning/transmission electron microscopy (SEM/TEM), scanning transmission electron microscopy (STEM), nano-beam electron diffraction (NBD or NBED), and reflection electron microscopy (REM); composition mapping; x-ray crystallography or diffraction (XRD); energy-dispersive x-ray spectroscopy (EDX); secondary ion mass spectrometry (SIMS); time-of-flight SIMS (ToF-SIMS); atom probe imaging or tomography; local electrode atom probe (LEAP) techniques; 3D tomography; or high resolution physical or chemical analysis, to name a few suitable example analytical tools. For instance, in some example embodiments, such tools may indicate the presence of a polymer layer or material layer containing boron and oxygen (or boron an nitrogen) along the edges of a gate cut, or otherwise between the gate cut and the source and drain regions. The boron-containing material layer may also be found on one or more portions of the source or drain regions that extend into the gate cut. Numerous configurations and variations will be apparent in light of this disclosure.

It should be readily understood that the meaning of "above" and "over" in the present disclosure should be interpreted in the broadest manner such that "above" and "over" not only mean "directly on" something but also include the meaning of over something with an intermediate feature or a layer therebetween. Further, spatially relative terms, such as "beneath," "below," "lower," "above," "upper," "top," "bottom," and the like, may be used herein for ease of description to describe one element or feature's relationship to another element (s) or feature (s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "layer" refers to a material portion including a region with a thickness. A monolayer is a layer that consists of a single layer of atoms of a given material. A layer can extend over the entirety of an underlying or overlying structure, or may have an extent less than the extent of an underlying or overlying structure. Further, a layer can be a region of a homogeneous or inhomogeneous continuous structure, with the layer having a thickness less than the thickness of the continuous structure. For example, a layer can be located between any pair of horizontal planes between, or at, a top surface and a bottom surface of the continuous structure. A layer can extend horizontally, vertically, and/or along a tapered surface. A layer can be conformal to a given surface (whether flat or curvilinear) with a relatively uniform thickness across the entire layer.

Materials that are "compositionally different" or "compositionally distinct" as used herein refers to two materials that have different chemical compositions. This compositional difference may be, for instance, by virtue of an element that is in one material but not the other (e.g., SiGe is compositionally different than silicon), or by way of one material having all the same elements as a second material but at least one of those elements is intentionally provided at a different concentration in one material relative to the other material (e.g., SiGe having 70 atomic percent germanium is compositionally different than from SiGe having 25 atomic percent germanium). In addition to such chemical composition diversity, the materials may also have distinct dopants (e.g., gallium and magnesium) or the same dopants but at differing concentrations. In still other embodiments, compositionally distinct materials may further refer to two materials that have different crystallographic orientations. For instance, (110) silicon is compositionally distinct or different from (100) silicon. Creating a stack of different orientations could be accomplished, for instance, with blanket wafer layer transfer. If two materials are elementally different, then one of the materials has an element that is not in the other material.

Architecture

Figure 1B:
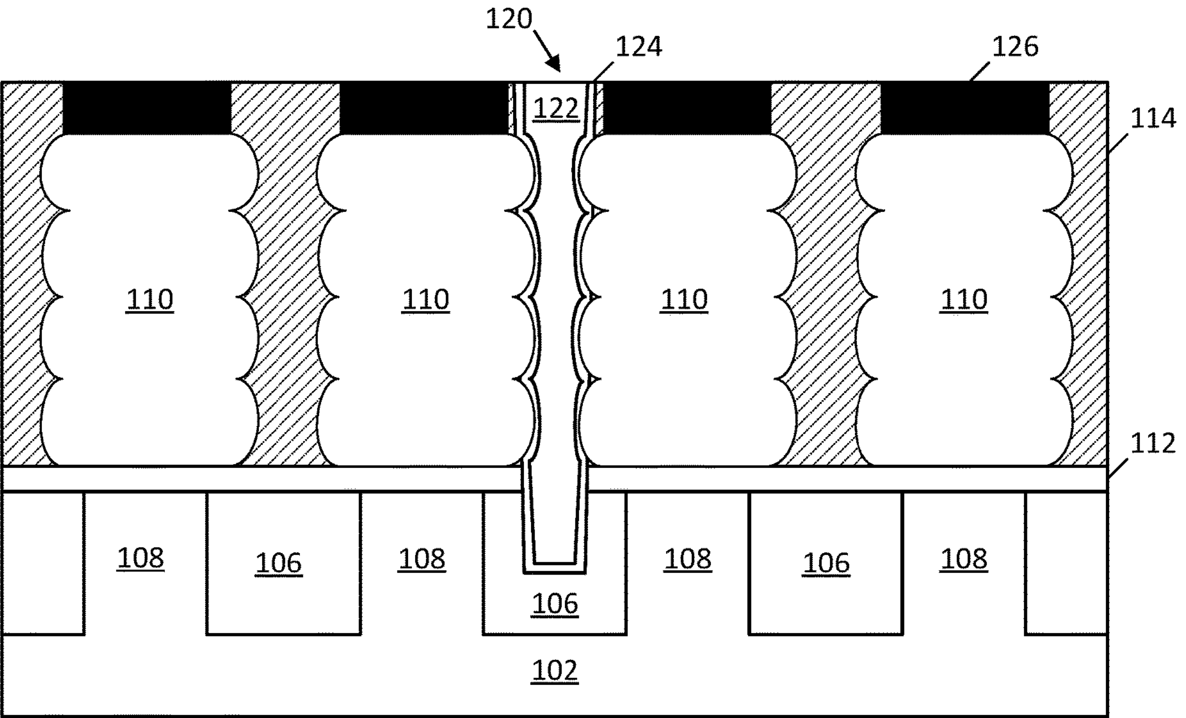

FIG. 1A is a cross sectional view taken across the gate trench of four example semiconductor devices with two of the devices identified as a first semiconductor device 101 and a second semiconductor device 103, according to an embodiment of the present disclosure. FIG. 1B is another cross sectional view taken across the source/drain trench adjacent to the gate trench either into or out of the page of FIG. 1A. Each of semiconductor devices 101 and 103 may be non-planar metal oxide semiconductor (MOS) transistors, such as tri-gate (e.g., finFET) or gate-all-around (GAA) transistors, although other transistor topologies and types could also benefit from the techniques provided herein. The illustrated embodiments herein use the GAA structure. The various illustrated semiconductor devices represent a portion of an integrated circuit that may contain any number of similar semiconductor devices.

As can be seen, semiconductor devices 101 and 103 are formed on a substrate 102. Any number of semiconductor devices can be formed on substrate 102, but four are illustrated here as an example. Substrate 102 can be, for example, a bulk substrate including group IV semiconductor material (such as silicon, germanium, or silicon germanium), group III-V semiconductor material (such as gallium arsenide, indium gallium arsenide, or indium phosphide), and/or any other suitable material upon which transistors can be formed. Alternatively, substrate 102 can be a semiconductor-on-insulator substrate having a desired semiconductor layer over a buried insulator layer (e.g., silicon over silicon dioxide). Alternatively, substrate 102 can be a multilayer substrate or superlattice suitable for forming nanowires or nanoribbons (e.g., alternating layers of silicon and SiGe, or alternating layers indium gallium arsenide and indium phosphide). Any number of substrates can be used. In some embodiments, a lower portion of (or all of) substrate 102 is removed and replaced with one or more backside interconnect layers to form backside signal and power routing, during a backside process.

Each of semiconductor devices 101 and 103 includes one or more nanoribbons 104 that extend parallel to one another along a direction between source or drain regions 110 (e.g., a first direction into and out of the page in the cross-section view of FIG. 1A). Nanoribbons 104 are one example of semiconductor regions or semiconductor bodies that extend between source or drain regions 110. The term nanoribbon may also encompass other similar shapes such as nanowires or nanosheets. The semiconductor material of nanoribbons 104 may be formed from substrate 102. In some embodiments, semiconductor devices 101 and 103 may each include semiconductor regions in the shape of fins that can be, for example, native to substrate 102 (formed from the substrate itself), such as silicon fins etched from a bulk silicon substrate. Alternatively, the fins can be formed of material deposited onto an underlying substrate. In one such example case, a blanket layer of silicon germanium (SiGe) can be deposited onto a silicon substrate, and then patterned and etched to form a plurality of SiGe fins extending from that substrate. In another such example, non-native fins can be formed in a so-called aspect ratio trapping based process, where native fins are etched away so as to leave fin-shaped trenches which can then be filled with an alternative semiconductor material (e.g., group IV or III-V material). In still other embodiments, the fins include alternating layers of material (e.g., alternating layers of silicon and SiGe) that facilitates forming of the illustrated nanoribbons 104 during a gate forming process where one type of the alternating layers is selectively etched away so as to liberate the other type of alternating layers within the channel region, so that a gate-all-around (GAA) process can then be carried out. Again, the alternating layers can be blanket deposited and then etched into fins or deposited into fin-shaped trenches.

As can further be seen, adjacent semiconductor devices are separated by a dielectric fill 106 that may include silicon oxide. Dielectric fill 106 provides shallow trench isolation (STI) between any adjacent semiconductor devices. Dielectric fill 106 can be any suitable dielectric material, such as silicon dioxide, aluminum oxide, or silicon oxycarbonitride.

Semiconductor devices 101 and 103 each include a subfin region 108. According to some embodiments, subfin region 108 comprises the same semiconductor material as substrate 102 and is adjacent to dielectric fill 106. According to some embodiments, nanoribbons 104 (or other semiconductor bodies) extend between source or drain regions 110 in the first direction to provide an active region for a transistor (e.g., the semiconductor region beneath the gate). It should be understood that the source or drain regions 110 illustrated in the cross-section of FIG. 1B are only along one side of nanoribbons 104 (e.g., out of the page of FIG. 1A) and that similar source or drain regions would be present along the opposite side of nanoribbons 104 (e.g., into the page of FIG. 1A).

According to some embodiments, source or drain regions 110 are epitaxial regions that are provided using an etch-and-replace process. In other embodiments source or drain regions 110 could be, for example, implantation-doped native portions of the semiconductor fins or substrate. Any semiconductor materials suitable for source and drain regions can be used (e.g., group IV and group III-V semiconductor materials). Source or drain regions 110 may include multiple layers such as liners and capping layers to improve contact resistance. In any such cases, the composition and doping of source or drain regions 110 may be the same or different, depending on the polarity of the transistors. In an example, for instance, one transistor is a p-type MOS (PMOS) transistor, and the other transistor is an n-type MOS (NMOS) transistor. Any number of source and drain configurations and materials can be used.

According to some embodiments, a lower dielectric layer 112 exists beneath source or drain regions 110. Lower dielectric layer 112 can include any suitable dielectric material, such as silicon oxide or silicon nitride and may be provided to isolate source or drain regions 110 from subfin regions 108. According to some embodiments, another dielectric fill 114 is provided around and over portions of source or drain regions 110 along the source/drain trench. Accordingly, each source or drain region 110 may be isolated from any adjacent source or drain regions 110 by dielectric fill 114. Dielectric fill 114 may be any suitable dielectric material, although in some embodiments, dielectric fill 114 includes the same dielectric material as dielectric fill 106 or lower dielectric layer 112. In one example, each of dielectric fill 114, lower dielectric layer 112, and dielectric fill 106 includes silicon oxide.

According to some embodiments, a first gate structure extends over nanoribbons 104 of semiconductor device 101 along a second direction across the page while a second gate structure extends over nanoribbons 104 of semiconductor device 103 along the second direction. Each gate structure includes a respective gate dielectric 116*a*/116*b* and a gate layer (or gate electrode) 118*a*/118*b*. Gate dielectric 116*a*/116*b* represents any number of dielectric layers present between nanoribbons 104 and gate layer 118*a*/118*b*. Gate dielectric 116*a*/116*b* may also be present on the surfaces of other structures within the gate trench, such as on subfin region 108. Gate dielectric 116*a*/116*b* may include any suitable gate dielectric material(s). In some embodiments, gate dielectric 116*a*/116*b* includes a layer of native oxide material (e.g., silicon oxide) on the nanoribbons or other semiconductor regions making up the channel region of the devices, and a layer of high-k dielectric material (e.g., hafnium oxide) on the native oxide.

Gate electrode 118*a*/118*b* may represent any number of conductive layers, such as any metal, metal alloy, or doped polysilicon layers. In some embodiments, gate electrode 118*a*/118*b* includes one or more workfunction metals around nanoribbons 104. In some embodiments, one of semiconductor devices 101 and 103 is a p-channel device that include a workfunction metal having titanium around its nanoribbons 104 and the other semiconductor device is an n-channel device that includes a workfunction metal having tungsten around its nanoribbons 104. Gate electrode 118*a*/118*b* may also include a fill metal or other conductive material around the workfunction metals to provide the whole gate electrode structure.

As further shown in this example, adjacent gate structures are separated along the second direction (e.g., across the page) by a gate cut 120, which acts like a dielectric barrier between gate structures. Gate cut 120 may include a sufficiently insulating material, such as a dielectric material 122. Example dielectric materials for gate cut 120 include silicon nitride, silicon oxide, silicon carbide, or silicon oxynitride. In some embodiments, gate cut 120 includes a polymer layer 124 along edges of the gate cut 120, such that dielectric material 122 is on polymer layer 124 and is present within the remaining volume of gate cut 120. Polymer layer 124 may include boron and further include oxygen or nitrogen and have a thickness between about 1 nm and about 3 nm. In some embodiments, polymer layer 124 directly contacts gate electrode 118*a* on one side of gate cut 120 and directly contacts gate electrode 118*b* on the opposite side of gate cut 120. Since gate cut 120 is formed after the formation of the gate structures, gate dielectric 116*a*/116*b* are not present along the sidewalls of gate cut 120 within the gate trench.

According to some embodiments, gate cut 120 also extends in the first direction (into and out of the page) such that it may cut across a portion of source or drain regions 110 as shown in FIG. 1B. However, in accordance with some embodiments, exposed portions of source or drain regions 110 are at least partially covered by polymer layer 124. In some cases, polymer layer 124 conformally coats around all exposed surfaces of source or drain regions 110 within the path of gate cut 120, as well as the other exposed structures (e.g., dielectric fill 106 and lower dielectric layer 112).

According to some embodiments, one or more conductive contacts 126 are present on or over one or more corresponding source or drain regions 110. Conductive contacts 126 may be any suitably conductive material such as tungsten (W). Other conductive materials may include copper (Cu), ruthenium (Ru), cobalt (Co), titanium (Ti), molybdenum (Mo), or any alloys thereof. Contacts 126 may include multiple layers, such as a silicide (e.g., tungsten silicide) and a fill metal (e.g., tungsten).

Fabrication Methodology

FIGS. 2A-9A and 2B-9B are cross-sectional views that collectively illustrate an example process for forming an integrated circuit configured with a gate cut having a polymer layer at its edges, in accordance with an embodiment of the present disclosure. FIGS. 2A-9A represent cross-sectional views taken across a gate trench portion of the integrated circuit along a second direction, while FIGS. 2B-9B represent cross-sectional views taken across the source/drain trench portion adjacent to the gate trench portion also along the second direction. Each figure shows an example structure that results from the process flow up to that point in time, so the depicted structure evolves as the process flow continues, culminating in the structure shown in FIGS. 9A and 9B, which is similar to the structure shown in FIGS. 1A and 1B, respectively. Such a structure may be part of an overall integrated circuit (e.g., such as a processor or memory chip) that includes, for example, digital logic cells and/or memory cells and analog mixed signal circuitry. Thus, the illustrated integrated circuit structure may be part of a larger integrated circuit that includes other integrated circuitry not depicted. Example materials and process parameters are given, but the present disclosure is not intended to be limited to any specific such materials or parameters, as will be appreciated. Figures sharing the same number (e.g., FIGS. 2A and 2B) illustrate different views of the structure at the same point in time during the process flow. Although the fabrication of a single gate cut is illustrated in the aforementioned figures, it should be understood that any number of similar gate cuts can be fabricated across the integrated circuit using the same processes discussed herein.

Figure 2A:
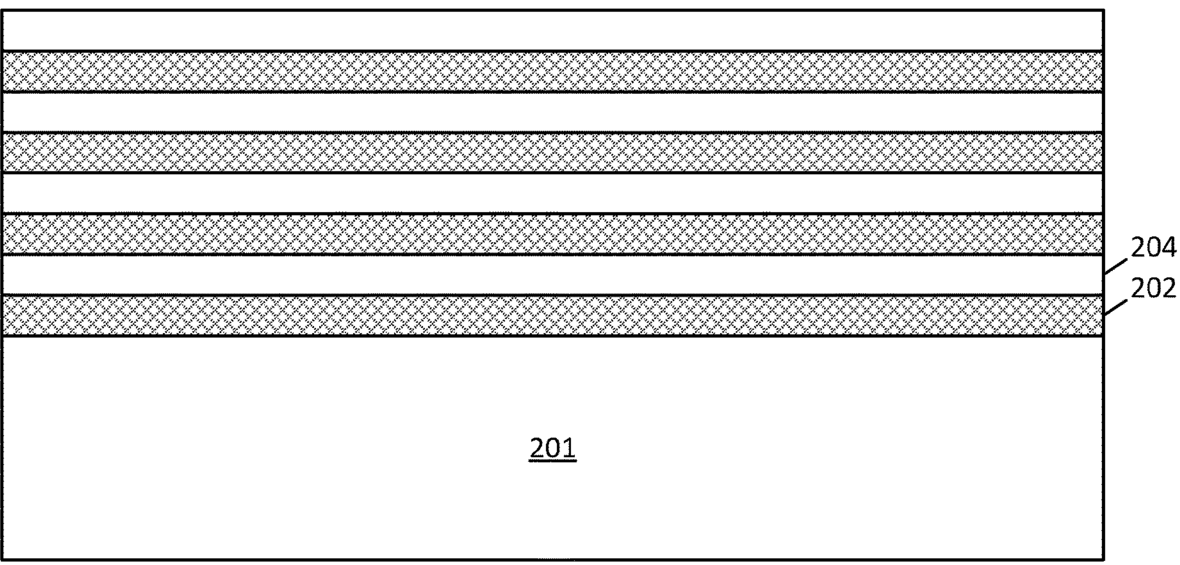
FIGS. 2A and 2B are cross-sectional views that illustrate a stage in an example process for forming semiconductor devices that have a gate cut between devices with a polymer layer between portions of the source or drain regions and the gate cut, in accordance with some embodiments of the present disclosure.
Figure 2B:
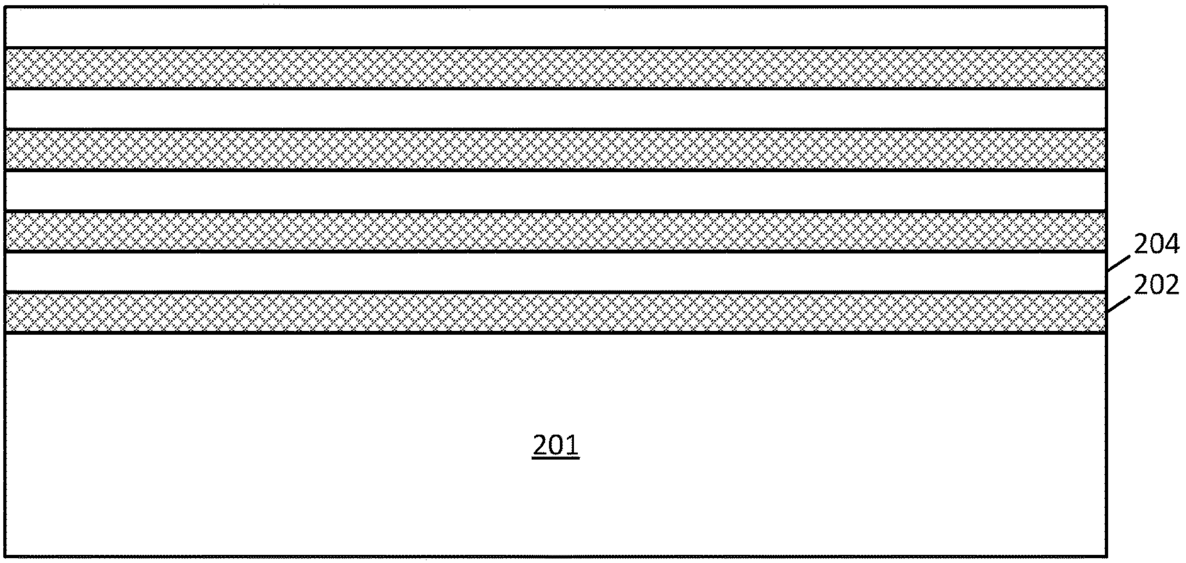

FIGS. 2A and 2B illustrate parallel cross-sectional views taken through a stack of alternating semiconductor layers on a semiconductor substrate 201. FIG. 2A is taken across a portion of the stack that will eventually become a gate trench while FIG. 2B is taken across a portion of the stack that will eventually become a source/drain trench adjacent and parallel to the gate trench. Alternating material layers may be deposited over substrate 201 including sacrificial layers 202 alternating with semiconductor layers 204. The alternating layers are used to form GAA transistor structures. Any number of alternating semiconductor layers 204 and sacrificial layers 202 may be deposited over substrate 201. The description above for substrate 102 applies equally to substrate 201.

According to some embodiments, sacrificial layers 202 have a different material composition than semiconductor layers 204. In some embodiments, sacrificial layers 202 are silicon germanium (SiGe) while semiconductor layers 204 include a semiconductor material suitable for use as a nanoribbon such as silicon (Si), SiGe, germanium, or III-V materials like indium phosphide (InP) or gallium arsenide (GaAs). In examples where SiGe is used in each of sacrificial layers 202 and in semiconductor layers 204, the germanium concentration is different between sacrificial layers 202 and semiconductor layers 204. For example, sacrificial layers 202 may include a higher germanium content compared to semiconductor layers 204. In some examples, semiconductor layers 204 may be doped with either n-type dopants (to produce a p-channel transistor) or p-type dopants (to produce an n-channel transistor).

While dimensions can vary from one example embodiment to the next, the thickness of each sacrificial layer 202 may be between about 5 nm and about 20 nm. In some embodiments, the thickness of each sacrificial layer 202 is substantially the same (e.g., within 1-2 nm). The thickness of each of semiconductor layers 204 may be about the same as the thickness of each sacrificial layer 202 (e.g., about 5-20 nm). Each of sacrificial layers 202 and semiconductor layers 204 may be deposited using any known or proprietary material deposition technique, such as chemical vapor deposition (CVD), plasma-enhanced chemical vapor deposition (PECVD), physical vapor deposition (PVD), or atomic layer deposition (ALD).

Figure 3A:
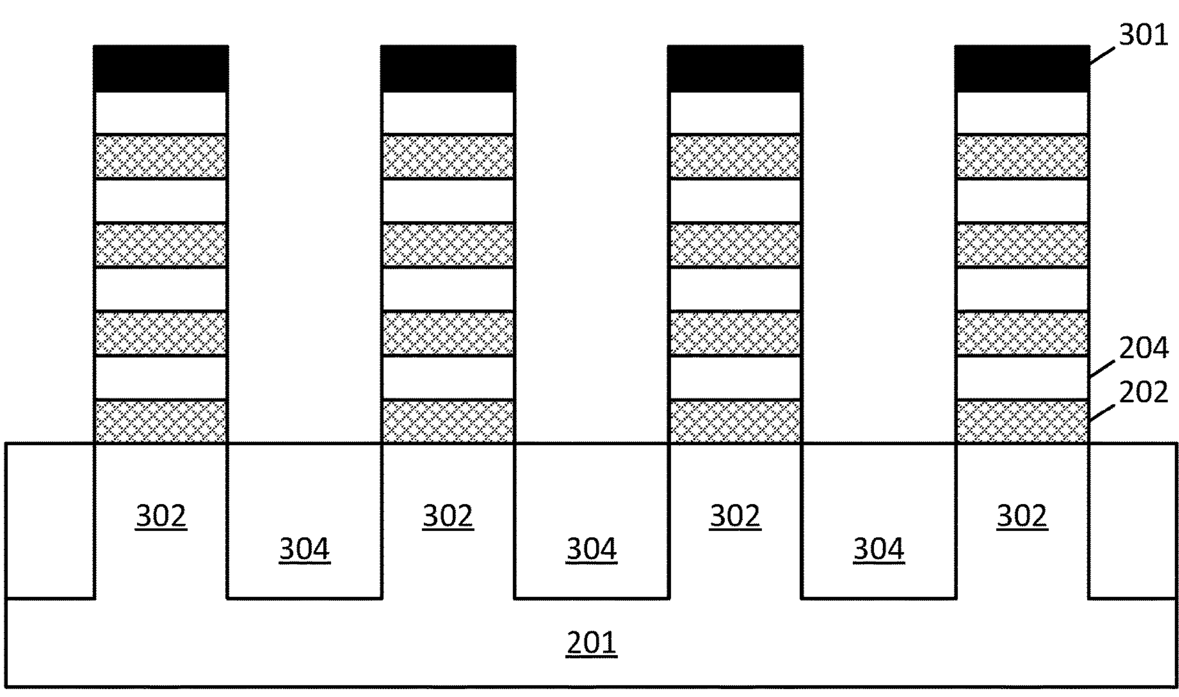
FIGS. 3A and 3B are cross-sectional views that illustrate another stage in the example process for forming semiconductor devices that have a gate cut between devices with a polymer layer between portions of the source or drain regions and the gate cut, in accordance with some embodiments of the present disclosure.
Figure 3B:
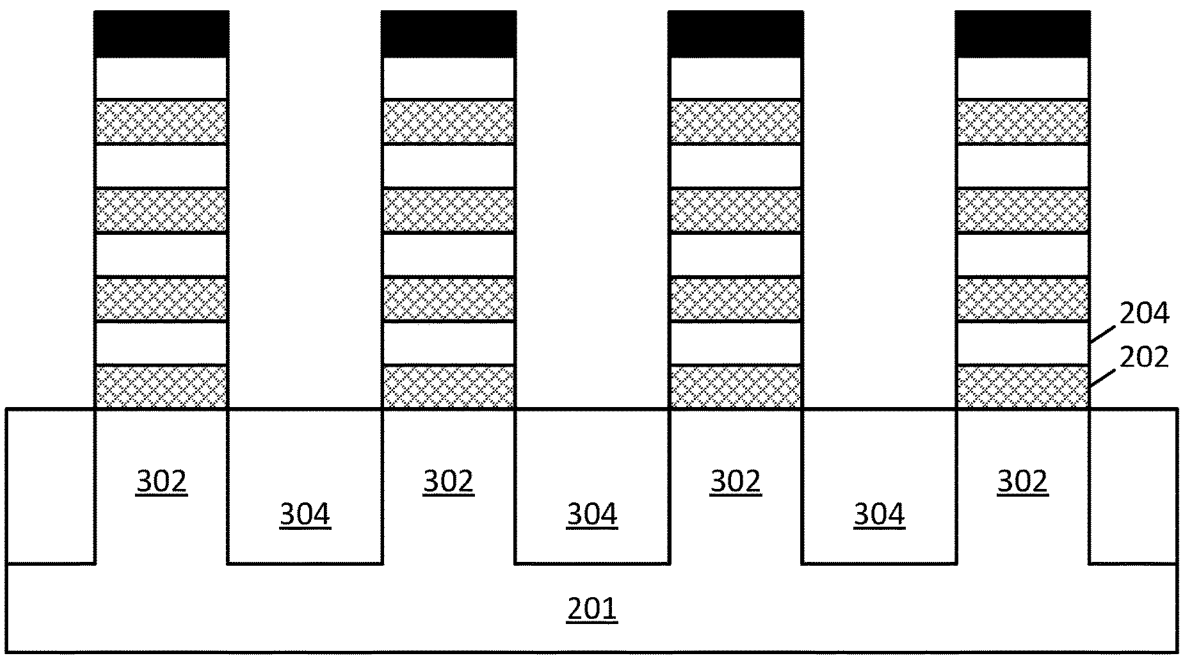

FIGS. 3A and 3B depict the cross-section views of the structure shown in FIGS. 2A and 2B, respectively, following the formation of a cap layer 301 and the subsequent formation of fins beneath cap layer 301, according to an embodiment. Cap layer 301 may be any suitable hard mask material such as a carbon hard mask (CHM) or silicon nitride. Cap layer 301 is patterned into rows to form corresponding rows of fins from the alternating layer stack of sacrificial layers 202 and semiconductor layers 204. The rows of fins extend lengthwise in a first direction (e.g., into and out of the page of each cross-section view).

According to some embodiments, an anisotropic etching process through the layer stack continues into at least a portion of substrate 201, where the unetched portions of substrate 201 beneath the fins form subfin regions 302. The etched portions of substrate 201 may be filled with a dielectric fill 304 that acts as shallow trench isolation (STI) between adjacent fins. Dielectric fill 304 may be any suitable dielectric material such as silicon oxide, and may be recessed to a desired depth as shown (in this example case, down to around the upper surface of the subfins), so as to define the active portion of the fins that will be covered by a gate structure.

Figure 4A:
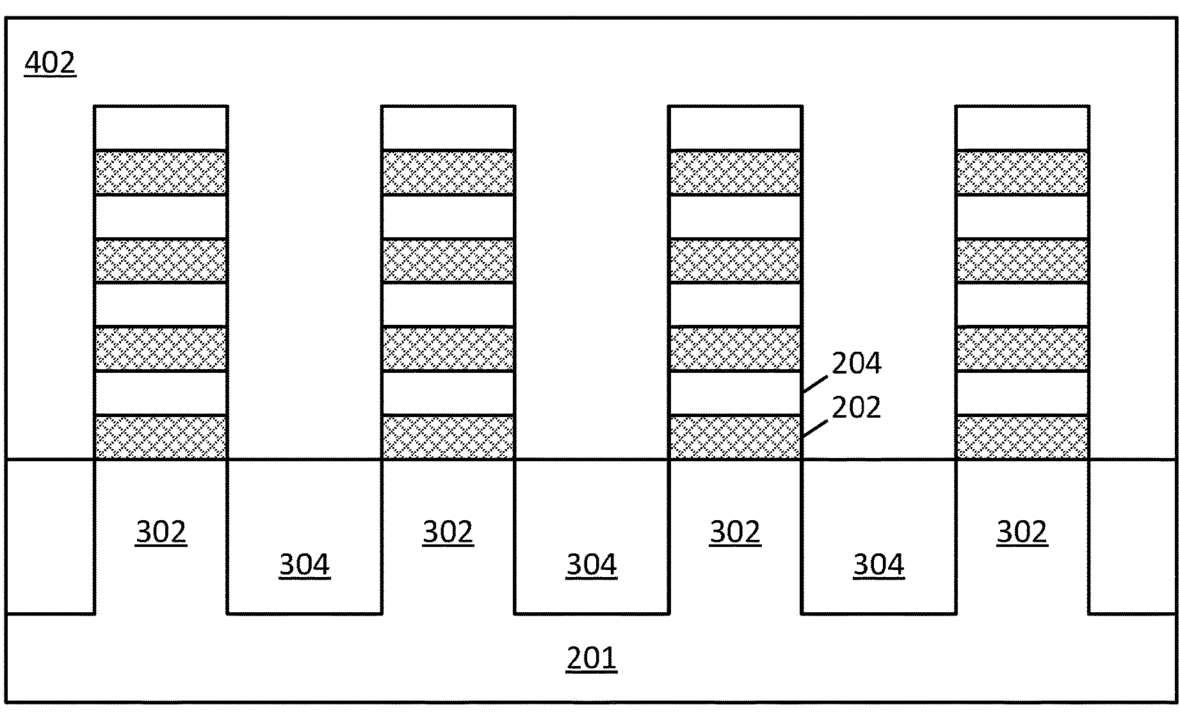
FIGS. 4A and 4B are cross-sectional views that illustrate another stage in the example process for forming semiconductor devices that have a gate cut between devices with a polymer layer between portions of the source or drain regions and the gate cut, in accordance with some embodiments of the present disclosure.
Figure 4B:
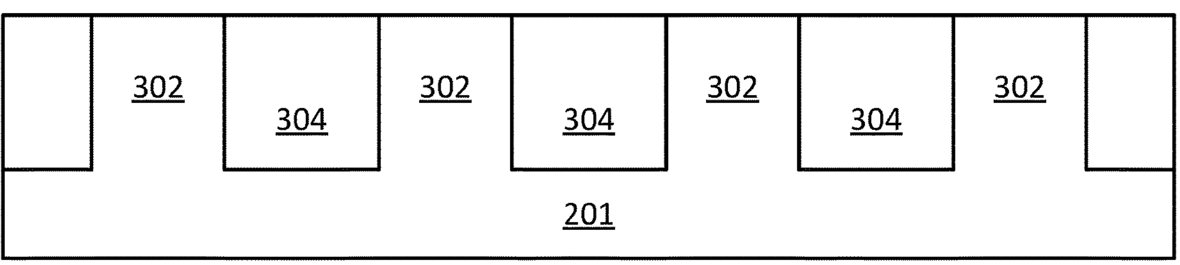

FIGS. 4A and 4B depict the cross-section views of the structure shown in FIGS. 3A and 3B, respectively, following the formation of a sacrificial gate 402 extending across the fins in a second direction different from the first direction, according to some embodiments. Sacrificial gate 402 may extend across the fins in a second direction that is orthogonal to the first direction. According to some embodiments, the sacrificial gate material is formed in parallel strips across the integrated circuit and removed in all areas not protected by a gate masking layer. Sacrificial gate 402 may be any suitable material that can be selectively removed without damaging the semiconductor material of the fins. In some examples, sacrificial gate 402 includes polysilicon.

As seen in the cross-section views, sacrificial gate 402 extends across the fins along the gate trench cross-section of FIG. 4A but is not present along the source/drain trench cross-section of FIG. 4B. Accordingly, sacrificial gate 402 (along with any gate spacers formed on the sidewalls of sacrificial gate 402) protect the underlying portions of the fins while the exposed portions of the fins are etched away as seen in FIG. 4B. According to some embodiments, both semiconductor layers 204 and sacrificial layers 202 are etched at substantially the same rate using an anisotropic RIE process. As observed in FIG. 4B, the fins are completely removed above subfin regions 302. In some embodiments, the RIE process may also etch into subfin regions 302 thus recessing subfin regions 302 beneath a top surface of dielectric fill 304.

Figure 5A:
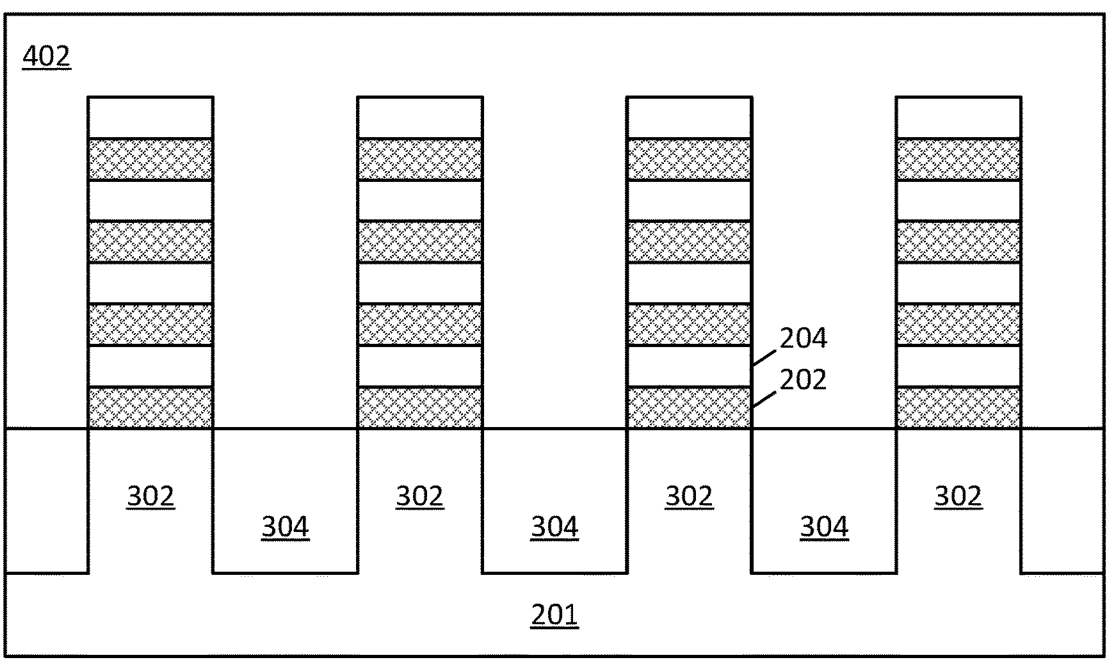
FIGS. 5A and 5B are cross-sectional views that illustrate another stage in the example process for forming semiconductor devices that have a gate cut between devices with a polymer layer portions of the source or drain regions and the gate cut, in accordance with some embodiments of the present disclosure.
Figure 5B:
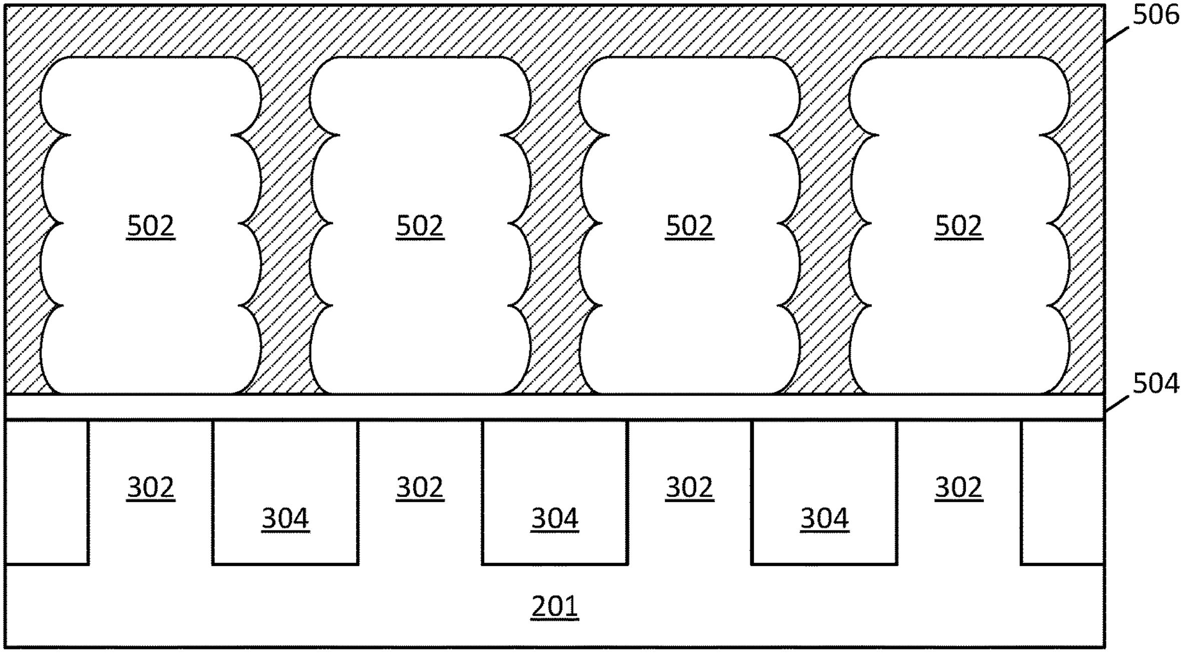

FIGS. 5A and 5B depict the cross-section views of the structure shown in FIGS. 4A and 4B, respectively, following the formation of source or drain regions 502 at the ends of each of the fins (extending into and out of the page in FIG. 5A), according to some embodiments. Source or drain regions 502 may be epitaxially grown from the exposed ends of semiconductor layers 204, such that the material grows together or otherwise merges towards the middle of the trenches between fins, according to some embodiments. Note that epitaxial growth on one semiconductor layer 204 can fully or partially merge with epitaxial growth on one or more other semiconductor layers 204 in the same vertical stack. The degree of any such merging can vary from one embodiment to the next. In the example of a PMOS device, a given source or drain region 502 may be a semiconductor material (e.g., group IV or group III-V semiconductor materials) having a higher dopant concentration of p-type dopants compared to n-type dopants. In the example of an NMOS device, a given source or drain region 502 may be a semiconductor material (e.g., group IV or group III-V semiconductor materials) having a higher dopant concentration of n-type dopants compared to p-type dopants. According to some embodiments, the various source or drain regions 502 grown from different semiconductor devices may be aligned along the second direction as shown in FIG. 5B.

According to some embodiments, a bottom dielectric layer 504 may be deposited prior to the formation of source or drain regions 502. Bottom dielectric layer 504 may be any suitable dielectric material, such as silicon oxide, silicon nitride, or silicon oxynitride. Bottom dielectric layer 504 may be included to provide isolation between source or drain regions 502 and subfin regions 302.

According to some embodiments, another dielectric fill 506 is provided along the source/drain trench. Dielectric fill 506 may extend between adjacent ones of the source or drain regions 502 along the second direction and also may extend up and over each of the source or drain regions 502, according to some embodiments. Accordingly, each source or drain region 502 may be isolated from any adjacent source or drain regions 502 by dielectric fill 506. Dielectric fill 506 may be any suitable dielectric material, although in some embodiments, dielectric fill 506 includes the same dielectric material as dielectric fill 304 or bottom dielectric layer 504. In one example, each of dielectric fill 506, bottom dielectric layer 504, and dielectric fill 304 includes silicon oxide. Dielectric fill 506 may not be present between certain adjacent source or drain regions in situations where the adjacent source or drain regions are desired to be electrically coupled together. According to some embodiments, a top surface of dielectric fill 506 may be polished using, for example, chemical mechanical polishing (CMP). The top surface of dielectric fill 506 may be polished until it is substantially planar with a top surface of sacrificial gate 402. In some embodiments, inner gate spacers can be formed after the source/drain trenches are etched and before the epitaxial deposition is performed. For instance, a selective etch can be used to laterally recess sacrificial material 202, and that recess can then be filled with inner gate spacer material (e.g., silicon nitride or silicon oxynitride). Any excess gate spacer material can be removed with directional etching.

Figure 6A:
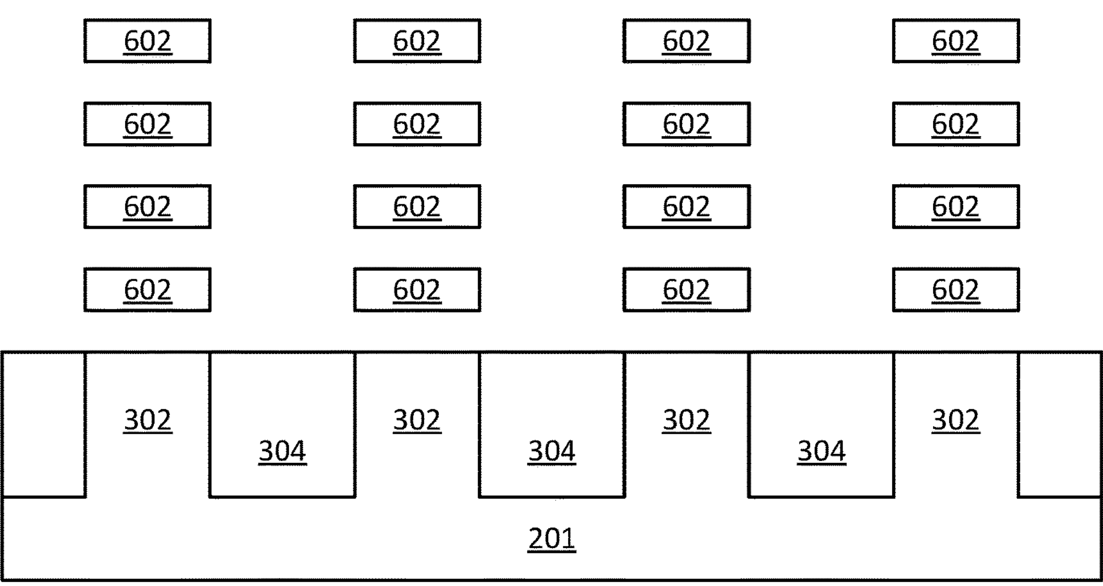
FIGS. 6A and 6B are cross-sectional views that illustrate another stage in the example process for forming semiconductor devices that have a gate cut between devices with a polymer layer between portions of the source or drain regions and the gate cut, in accordance with some embodiments of the present disclosure.
Figure 6B:
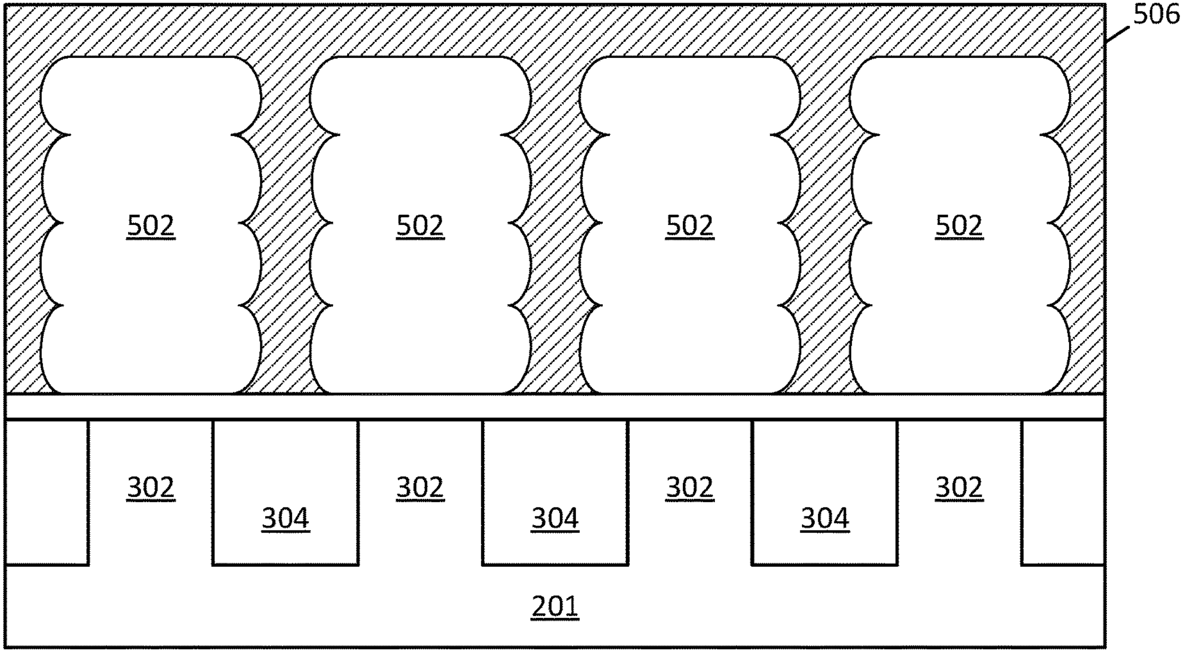

FIGS. 6A and 6B depict the cross-section views of the structure shown in FIGS. 5A and 5B, respectively, following the formation of nanoribbons 602 from semiconductor layers 204, according to some embodiments. Depending on the dimensions of the structures, nanoribbons 602 may also be considered nanowires or nanosheets. Sacrificial gate 402 may be removed using any wet or dry isotropic process thus exposing the alternating layer stack of the fins within the trenches left behind after the removal of sacrificial gate 402. Once sacrificial gate 402 is removed, sacrificial layers 202 may also be removed using a selective isotropic etching process that removes the material of sacrificial layers 202 but does not remove (or removes very little of) semiconductor layers 204 or any other exposed layers (e.g., inner gate spacers). At this point, the suspended (sometimes called released) semiconductor layers 204 form nanoribbons 602 that extend in the first direction (into and out of the page) between a first source or drain region 502 and a second source or drain region on the opposite ends of nanoribbons 602.

Figure 7A:
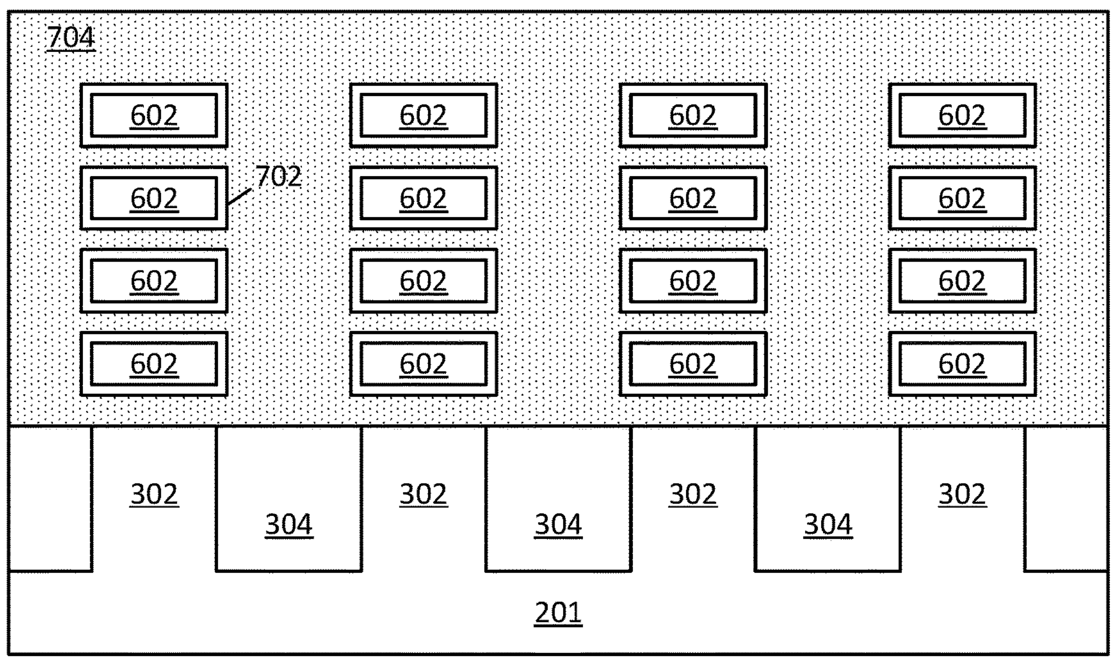
FIGS. 7A and 7B are cross-sectional views that illustrate another stage in the example process for forming semiconductor devices that have a gate cut between devices with a polymer layer between portions of the source or drain regions and the gate cut, in accordance with some embodiments of the present disclosure.
Figure 7B:
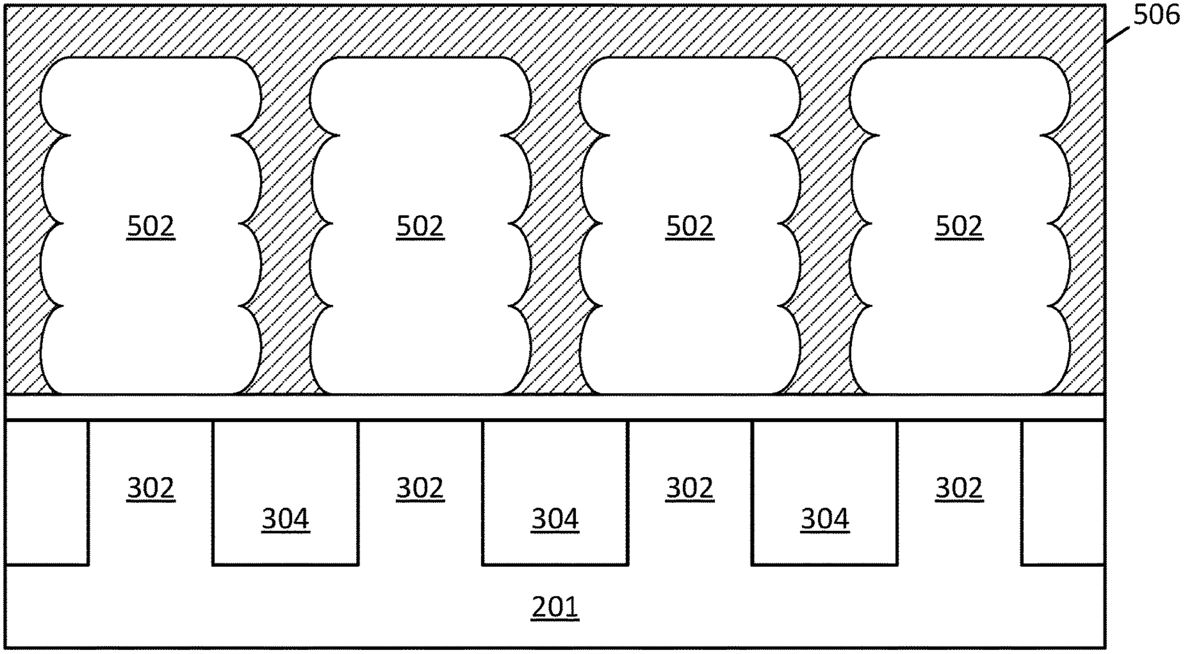

FIGS. 7A and 7B depict the cross-section views of the structure shown in FIGS. 6A and 6B, respectively, following the formation of a gate structure around nanoribbons 602 within the gate trench, according to some embodiments. As noted above, the gate structure includes a gate dielectric 702 and a gate electrode 704. Gate dielectric 702 may be conformally deposited around nanoribbons 602 using any suitable deposition process, such as atomic layer deposition (ALD). Gate dielectric 702 may include any suitable dielectric (such as silicon dioxide, and/or a high-k dielectric material). Examples of high-k dielectric materials include, for instance, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate, to provide some examples. According to some embodiments, gate dielectric 702 is hafnium oxide with a thickness between about 1 nm and about 5 nm. In some embodiments, gate dielectric 702 may include one or more silicates (e.g., titanium silicate, tungsten silicate, niobium silicate, and silicates of other transition metals). Gate dielectric 702 may be a multilayer structure, in some examples. For instance, gate dielectric 702 may include a first layer on nanoribbons 602, and a second layer on the first layer. The first layer can be, for instance, an oxide of the semiconductor layers (e.g., silicon dioxide) and the second layer can be a high-k dielectric material (e.g., hafnium oxide). In some embodiments, an annealing process may be carried out on gate dielectric 702 to improve its quality when a high-k dielectric material is used. In some embodiments, the high-k material can be nitridized to improve its aging resistance.

Gate electrode 704 may be deposited over gate dielectric 702 and can be any standard or proprietary conductive structure. In some embodiments, gate electrode 704 includes doped polysilicon, a metal, or a metal alloy. Example suitable metals or metal alloys include aluminum, tungsten, cobalt, molybdenum, ruthenium, titanium, tantalum, copper, and carbides and nitrides thereof. Gate electrode 704 may include, for instance, one or more workfunction layers, resistance-reducing layers, and/or barrier layers. The workfunction layers can include, for example, p-type workfunction materials (e.g., titanium nitride) for PMOS gates, or n-type workfunction materials (e.g., titanium aluminum carbide) for NMOS gates.

Figure 8A:
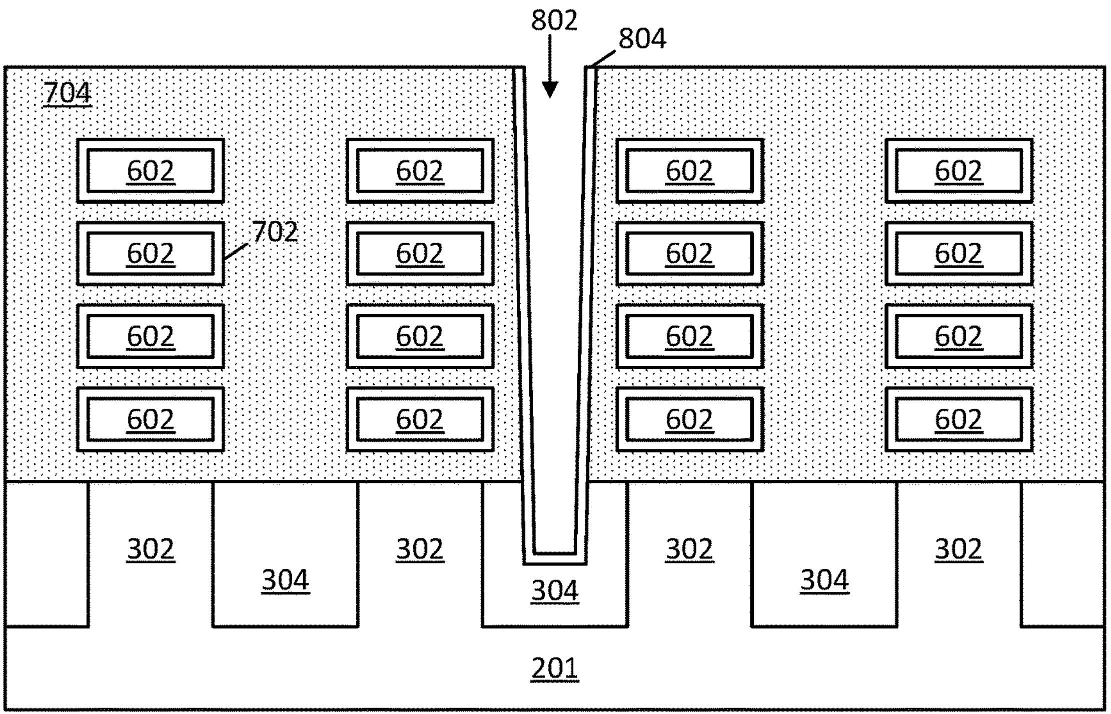
FIGS. 8A and 8B are cross-sectional views that illustrate another stage in the example process for forming semiconductor devices that have a gate cut between devices with a polymer layer between portions of the source or drain regions and the gate cut, in accordance with some embodiments of the present disclosure.
Figure 8B:
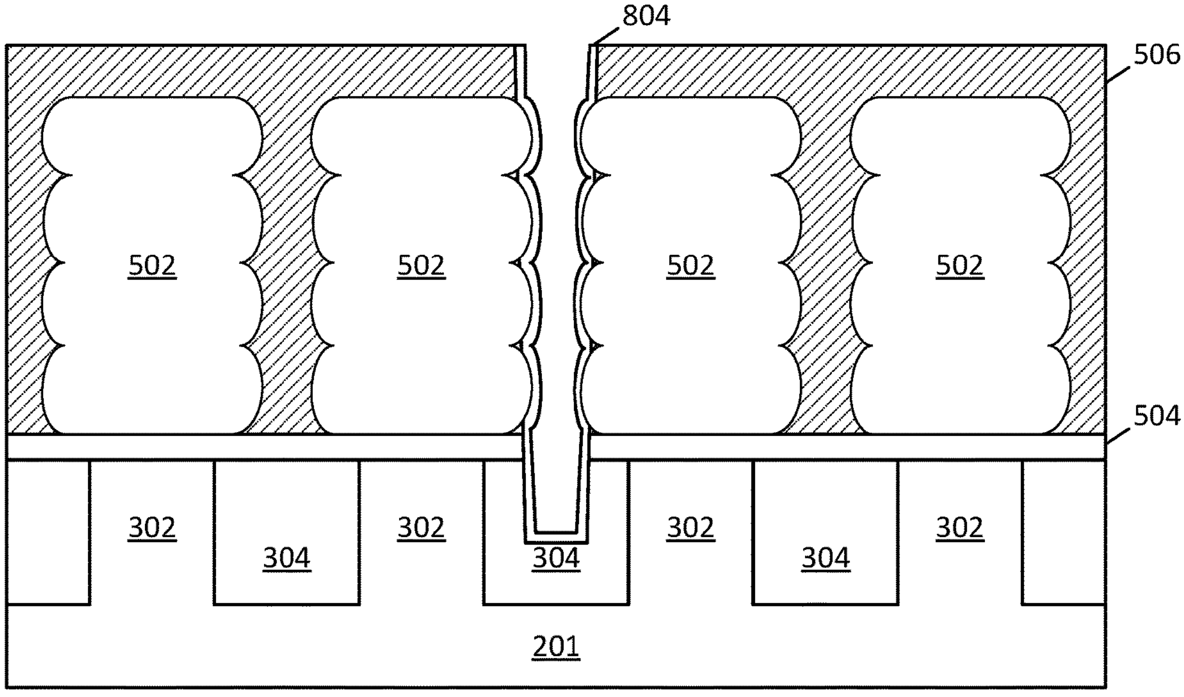

FIGS. 8A and 8B depict the cross-section views of the structure shown in FIGS. 7A and 7B, respectively, following the formation of a gate cut recess 802 through a thickness of the gate structure, according to some embodiments. Gate cut recess 802 may be formed using a metal gate etch process that iteratively etches through portions of gate electrode 704 while simultaneously protecting the sidewalls of the recess from lateral etching to provide a high height-to-width aspect ratio final gate cut recess 802 (e.g., aspect ratio of 5:1, 8:1, 10:1 or higher). Gate cut recess 802 may extend into at least a portion of dielectric fill 304 or even deeper into a portion of the underlying substrate 201.

According to some embodiments, the closeness of the devices along the second direction causes the gate cut recess to potentially expose portions of source or drain regions 502 within the source/drain trench as shown in FIG. 8B. The exposed source or drain regions 502 can then be susceptible to damage from later cleaning, ashing, or etch processes. During the etching process used to form gate cut recess 802, a polymer byproduct is produced that coats the sidewalls of gate cut recess 802 and forms a polymer layer 804. According to some example embodiments, a boron-based etch (e.g., using $BCl_3$) is used to form recess 802 and the resulting polymer layer 804 includes boron from the boron-based etchant gas used to etch through gate electrode 704. Polymer layer 804 may be formed as a byproduct from the reactions between the etchant gases used (e.g., $BCl_3$ and $CF_4$), the metal of gate electrode 704 (e.g., tungsten, titanium, ruthenium, or molybdenum), and any exposed spacer material (e.g., silicon nitride). According to some embodiments, rather than removing polymer layer 804 during a cleaning process, polymer layer 804 is instead hardened using a curing process and remains on the sidewalls of gate cut recess 802. Polymer layer 804 may be cured, for example, by being exposed to oxygen for a time period of at least 2 hours, at least 3 hours, or at least 4 hours. The curing environment may include, for instance, a combination of oxygen and nitrogen, pure air, or a combination of air and nitrogen. After hardening, polymer layer 804 includes at least boron and one or both of oxygen or nitrogen. Polymer layer 804 may have a thickness, for example, between about 1 nm and about 3 nm along the sidewalls of gate cut recess 802. As can be seen in FIG. 8B, polymer layer 804 also coats at least portions of the exposed source or drain regions 502 within the gate cut recess 802 to protect them from further damage.

Figure 9A:
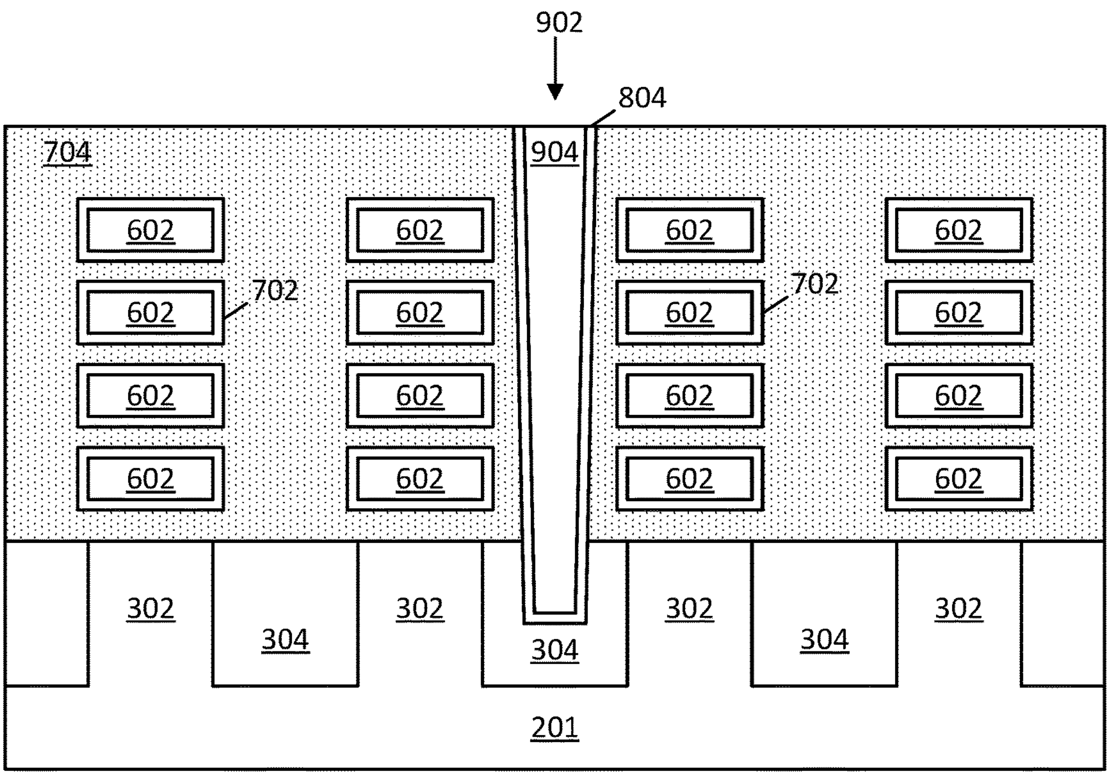
FIGS. 9A and 9B are cross-sectional views that illustrate another stage in the example process for forming semiconductor devices that have a gate cut between devices with a polymer layer between portions of the source or drain regions and the gate cut, in accordance with some embodiments of the present disclosure.
Figure 9B:
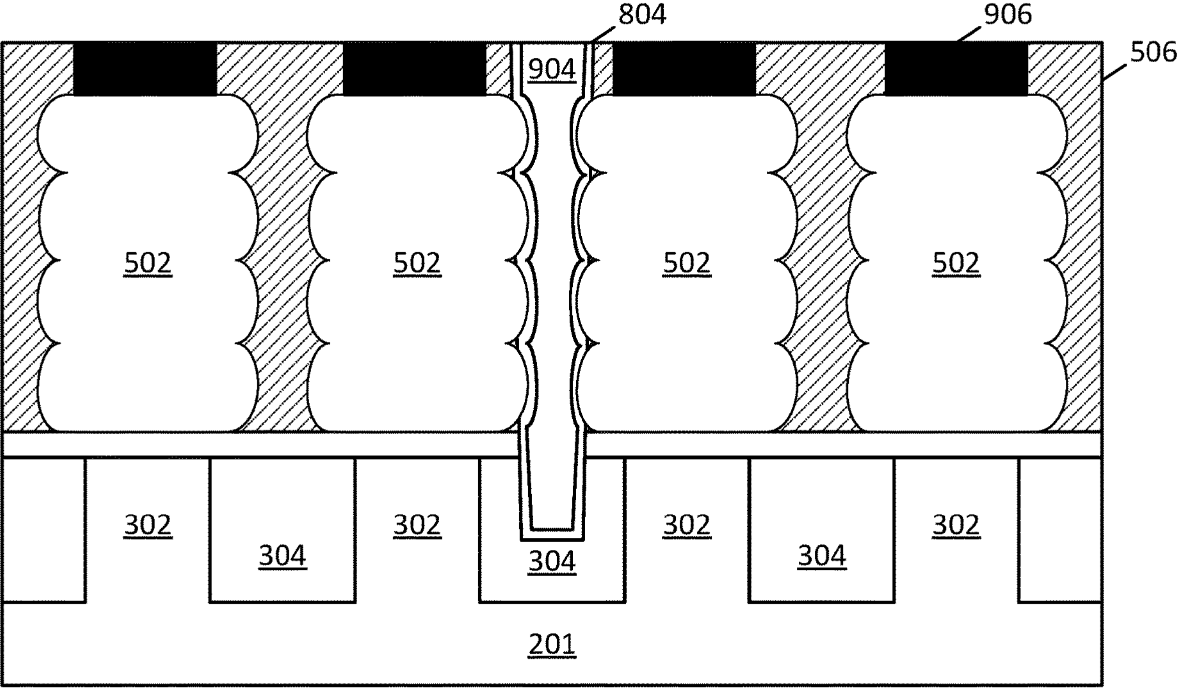

FIGS. 9A and 9B depict the cross-section views of the structure shown in FIGS. 8A and 8B, respectively, following the formation of a gate cut 902, according to some embodiments. Gate cut 902 may include one or more dielectric materials that fill the remaining portion of gate cut recess 802 on polymer layer 804. Thus, according to some embodiments, gate cut 902 includes polymer layer 804 at edges of gate cut 902 and a dielectric material 904 within a remaining volume of gate cut recess 802 on polymer layer 804. Dielectric material 904 may include only silicon oxide or silicon nitride or silicon carbide. In some examples, dielectric material 904 includes a first dielectric layer on polymer layer 804 and a second dielectric layer within a remaining volume. The first dielectric layer may include a high-k dielectric material (e.g., materials with a dielectric constant higher than that of silicon oxide) while the second dielectric layer may include a low-k dielectric material (e.g. materials with a dielectric constant equal to or lower than that of silicon oxide, such as porous silicon oxide). Since gate cut 902 is formed after the formation of the gate structure, gate dielectric 702 does not form along any sidewall of gate cut 902. Polymer layer 804 directly contacts gate electrode 704 on either side of gate cut 902 within the gate trench, in this example case.

According to some embodiments, conductive contacts 906 may be formed over various ones of source or drain regions 502. Conductive contacts 906 may be any suitably conductive material such as tungsten (W). Other conductive materials may include copper (Cu), ruthenium (Ru), cobalt (Co), titanium (Ti), tungsten (W), molybdenum (Mo), or any alloys thereof. Conductive contacts 906 may be formed within recesses formed through dielectric fill 506 and may extend around side portions of source or drain regions 502. Conductive contacts 906 may be formed by depositing a suitable conductive material using any deposition process such as CVD or PVD. Contacts 126 may include multiple layers, such as a silicide (e.g., copper silicide) and a fill metal (e.g., copper). A top surface of conductive contacts 906 may be polished using CMP to be substantially planar with a top surface of dielectric fill 506.

Figure 10:
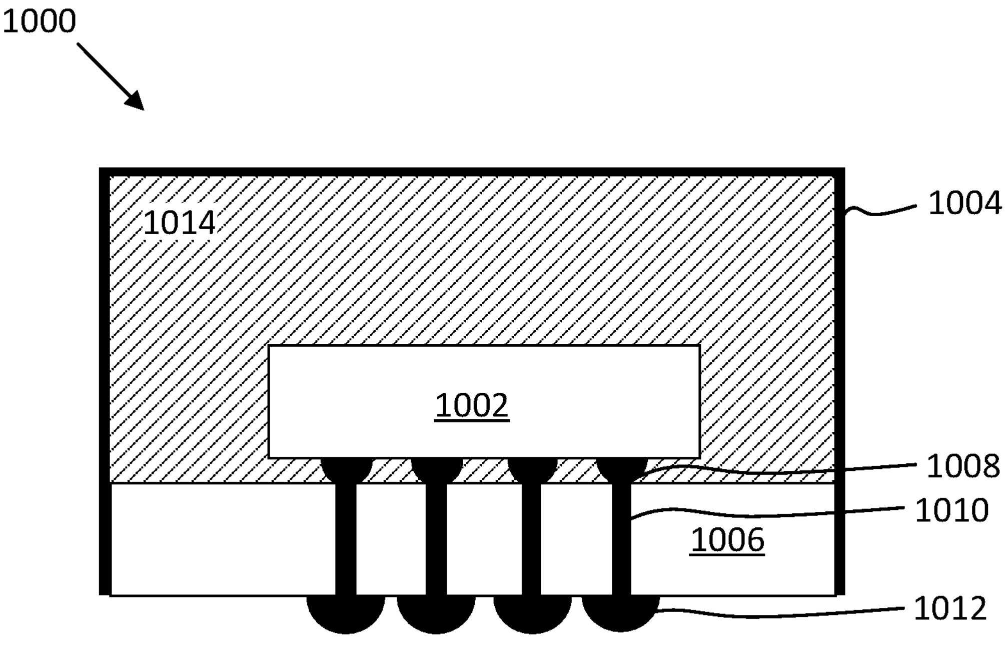
FIG. 10 illustrates a cross-sectional view of a chip package containing one or more semiconductor dies, in accordance with some embodiments of the present disclosure.

FIG. 10 illustrates an example embodiment of a chip package 1000, in accordance with an embodiment of the present disclosure. As can be seen, chip package 1000 includes one or more dies 1002. One or more dies 1002 may include at least one integrated circuit having semiconductor devices, such as any of the semiconductor devices disclosed herein. One or more dies 1002 may include any other circuitry used to interface with other devices formed on the dies, or other devices connected to chip package 1000, in some example configurations.

As can be further seen, chip package 1000 includes a housing 1004 that is bonded to a package substrate 1006. The housing 1004 may be any standard or proprietary housing, and may provide, for example, electromagnetic shielding and environmental protection for the components of chip package 1000. The one or more dies 1002 may be conductively coupled to a package substrate 1006 using connections 1008, which may be implemented with any number of standard or proprietary connection mechanisms, such as solder bumps, ball grid array (BGA), pins, or wire bonds, to name a few examples. Package substrate 1006 may be any standard or proprietary package substrate, but in some cases includes a dielectric material having conductive pathways (e.g., including conductive vias and lines) extending through the dielectric material between the faces of package substrate 1006, or between different locations on each face. In some embodiments, package substrate 1006 may have a thickness less than 1 millimeter (e.g., between 0.1 millimeters and 0.5 millimeters), although any number of package geometries can be used. Additional conductive contacts 1012 may be disposed at an opposite face of package substrate 1006 for conductively contacting, for instance, a printed circuit board (PCB). One or more vias 1010 extend through a thickness of package substrate 1006 to provide conductive pathways between one or more of connections 1008 to one or more of contacts 1012. Vias 1010 are illustrated as single straight columns through package substrate 1006 for ease of illustration, although other configurations can be used (e.g., damascene, dual damascene, through-silicon via, or an interconnect structure that meanders through the thickness of substrate 1006 to contact one or more intermediate locations therein). In still other embodiments, vias 1010 are fabricated by multiple smaller stacked vias, or are staggered at different locations across package substrate 1006. In the illustrated embodiment, contacts 1012 are solder balls (e.g., for bump-based connections or a ball grid array arrangement), but any suitable package bonding mechanism may be used (e.g., pins in a pin grid array arrangement or lands in a land grid array arrangement). In some embodiments, a solder resist is disposed between contacts 1012, to inhibit shorting.

In some embodiments, a mold material 1014 may be disposed around the one or more dies 1002 included within housing 1004 (e.g., between dies 1002 and package substrate 1006 as an underfill material, as well as between dies 1002 and housing 1004 as an overfill material). Although the dimensions and qualities of the mold material 1014 can vary from one embodiment to the next, in some embodiments, a thickness of mold material 1014 is less than 1 millimeter. Example materials that may be used for mold material 1014 include epoxy mold materials, as suitable. In some cases, the mold material 1014 is thermally conductive, in addition to being electrically insulating.

Methodology

Figure 11:
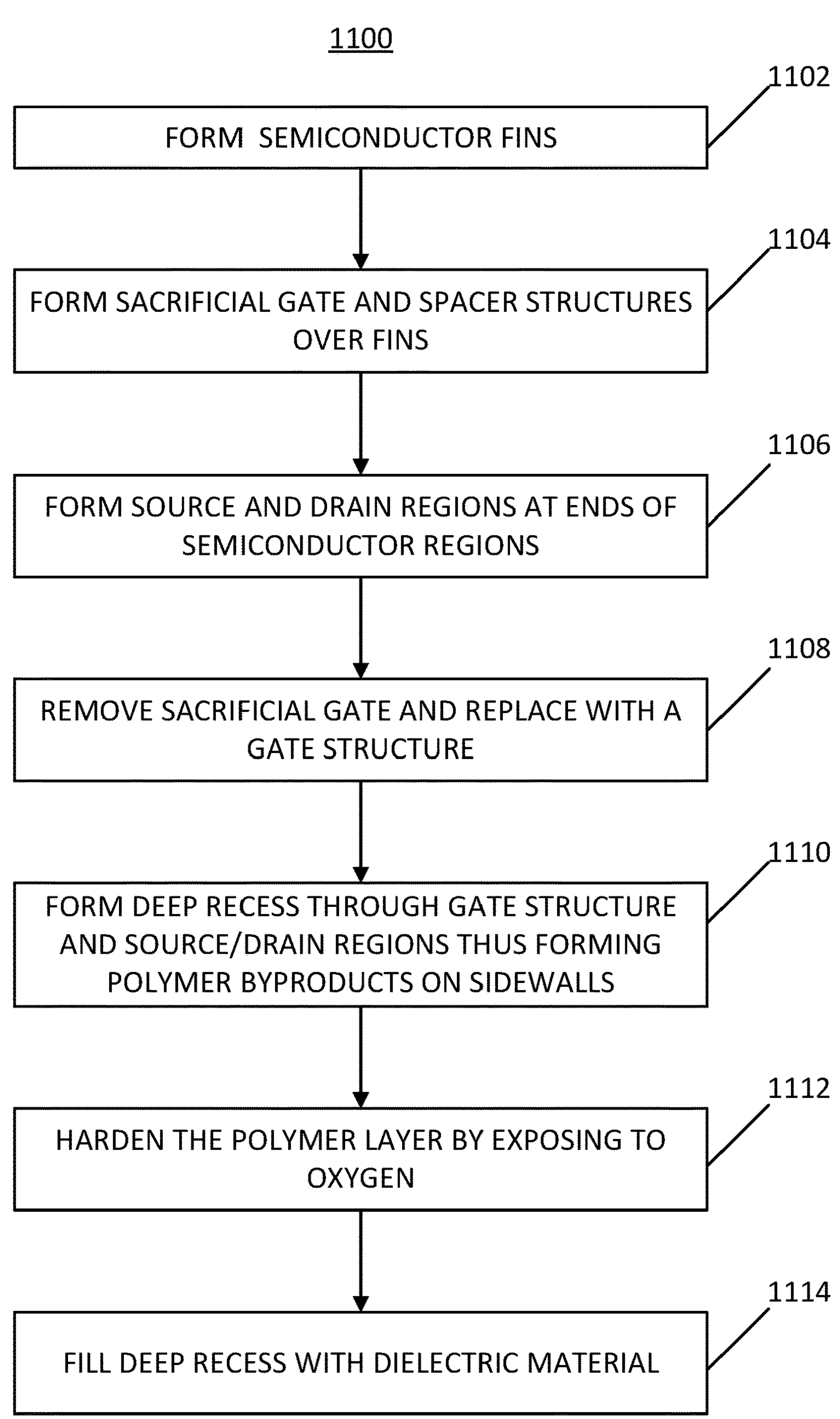
FIG. 11 is a flowchart of a fabrication process for semiconductor devices having a gate cut between devices with a polymer layer between portions of the source or drain regions and the gate cut, in accordance with an embodiment of the present disclosure.

FIG. 11 is a flow chart of a method 1100 for forming at least a portion of an integrated circuit, according to an embodiment. Various operations of method 1100 may be illustrated in FIGS. 2A-9A and FIGS. 2B-9B. However, the correlation of the various operations of method 1100 to the specific components illustrated in the aforementioned figures is not intended to imply any structural and/or use limitations. Rather, the aforementioned figures provide one example embodiment of method 1100. Other operations may be performed before, during, or after any of the operations of method 1100. For example, method 1100 does not explicitly describe all processes that are performed to form common transistor structures. Some of the operations of method 1100 may be performed in a different order than the illustrated order.

Method 1100 begins with operation 1102 where a plurality of parallel semiconductor fins are formed, according to some embodiments. The semiconductor material in the fins may be formed from a substrate such that the fins are an integral part of the substrate (e.g., etched from a bulk silicon substrate). Alternatively, the fins can be formed of material deposited onto an underlying substrate. In one such example case, a blanket layer of silicon germanium (SiGe) can be deposited onto a silicon substrate, and then patterned and etched to form a plurality of SiGe fins extending from that substrate. In another such example, the fins include alternating layers of material (e.g., alternating layers of silicon and SiGe) that facilitates forming of nanowires and nanoribbons during a gate forming process where one type of the alternating layers are selectively etched away so as to liberate the other type of alternating layers within the channel region, so that a gate-all-around (GAA) process can then be carried out. The alternating layers can be blanket deposited and then etched into fins, or deposited into fin-shaped trenches. The fins may also include a cap structure over each fin that is used to define the locations of the fins during, for example, an RIE process. The cap structure may be a dielectric material, such as silicon nitride.

According to some embodiments, a dielectric fill is formed around subfin portions of the one or more fins. In some embodiments, the dielectric fill extends between each pair of adjacent parallel fins and runs lengthwise in the same direction as the fins. In some embodiments, the anisotropic etching process that forms the fins also etches into a portion of the substrate and the dielectric fill may be formed within the recessed portions of the substrate. Accordingly, the dielectric fill acts as shallow trench isolation (STI) between adjacent fins. The dielectric fill may be any suitable dielectric material, such as silicon oxide.

Method 1100 continues with operation 1104 where a sacrificial gate and spacer structures are formed over the fins. The sacrificial gate may be patterned using a gate masking layer in a strip that runs orthogonally over the fins (many gate masking layers and corresponding sacrificial gates may be formed parallel to one another (e.g., forming a cross-hatch pattern with the fins). The gate masking layer may be any suitable hard mask material, such as CHM or silicon nitride. The sacrificial gate may be formed from any suitable material that can be selectively removed at a later time without damaging the semiconductor material of the fins. In one example, the sacrificial gate includes polysilicon. The spacer structures may be deposited and then etched back such that the spacer structures remain mostly only on sidewalls of any exposed structures, such as on sidewalls of the sacrificial gate. According to some embodiments, the spacer structures may be any suitable dielectric material, such as silicon nitride or silicon oxynitride.

Method 1100 continues with operation 1106 where source or drain regions are formed at the ends of the semiconductor regions of each of the fins. Any portions of the fins not protected by the sacrificial gate and spacer structures may be removed using, for example, an anisotropic etching process followed by the epitaxial growth of the source or drain regions from the exposed ends of the semiconductor layers in the fins. In some example embodiments, the source or drain regions are NMOS source or drain regions (e.g., epitaxial silicon) or PMOS source or drain regions (e.g., epitaxial SiGe). Another dielectric fill may be formed adjacent to the various source or drain regions for additional electrical isolation between adjacent regions. The dielectric fill may also extend over a top surface of the source or drain regions. In some embodiments, topside conductive contacts may be formed through the dielectric fill to contact one or more of the source or drain regions. As described above, internal gate spacers may be formed during the source drain processing (e.g., after source drain recess but prior to epi growth of source/drain regions, using a lateral etch process that selectively recesses sacrificial material of the channel region and then filling that recess with internal gate spacer material).

Method 1100 continues with operation 1108 where the sacrificial gate is removed and replaced with a gate structure. The sacrificial gate may be removed using an isotropic etching process that selectively removes all of the material from the sacrificial gate, thus exposing the various fins between the set of spacer structures. In the example case where GAA transistors are used, any sacrificial layers within the exposed fins between the spacer structures may also be removed to release nanoribbons, nanosheets, or nanowires of semiconductor material.

The gate structure may include both a gate dielectric and a gate electrode. The gate dielectric is first formed over the exposed semiconductor regions between the spacer structures followed by forming the gate electrode within the remainder of the trench between the spacer structures, according to some embodiments. The gate dielectric may include any number of dielectric layers deposited using a CVD process, such as ALD. The gate electrode can include any number of conductive material layers, such as any metals, metal alloys, or polysilicon. The gate electrode may be deposited using electroplating, electroless plating, CVD, ALD, PECVD, or PVD, to name a few examples.

Method 1100 continues with operation 1110 where a deep recess is formed through at least a full thickness of the gate structure and through at least a portion of the source or drain regions. According to some embodiments, the etching process used to remove the metal material of the gate electrode forms a polymer layer as a byproduct on the sidewalls of the deep recess. The deep recess may be formed between adjacent devices (e.g., adjacent fins or adjacent nanowire stacks). The deep recess extends in the same direction as the fins or nanowires between the source or drain regions. Due to the closeness of the devices, the deep recess may expose portions of the source or drain regions. According to some embodiments, the polymer layer also forms on the exposed portions of the source or drain regions within the deep recess. The polymer layer may include boron and may have a thickness between about 1 nm and about 3 nm.

Method 1100 continues with operation 1112 where the polymer layer is exposed to an environment containing oxygen, thus hardening the polymer layer. According to some embodiments, the polymer layer is exposed to an environment with oxygen for at least 2 hours, at least 3 hours, or at least 4 hours. The oxygen environment may include pure air, a mixture of oxygen and nitrogen, or a mixture of air and nitrogen, to name a few examples. The exposure to oxygen causes a hardening reaction within the polymer layer and makes it less susceptible to future etchants or cleans. In some embodiments, the polymer layer contains both boron and oxygen or both boron and nitrogen following the hardening operation.

Method 1100 continues with operation 1114 where any remaining portion of the deep recess is filled with a dielectric material to complete the formation of a gate cut through the gate structure. The dielectric material may include one or more different dielectrics. For example, the dielectric material may include only silicon oxide or silicon nitride. In some examples, the dielectric material includes a first dielectric layer on the polymer layer and a second dielectric layer on the first dielectric layer within a remaining volume of the deep recess. The first dielectric layer may include a high-k dielectric material (e.g. materials with a dielectric constant higher than that of silicon oxide) while the second dielectric layer may include a low-k dielectric material (e.g. materials with a dielectric constant equal to or lower than that of silicon oxide). The gate cut includes the polymer layer at its edges and the dielectric material within the remaining volume of the deep recess.

Example System

Figure 12:
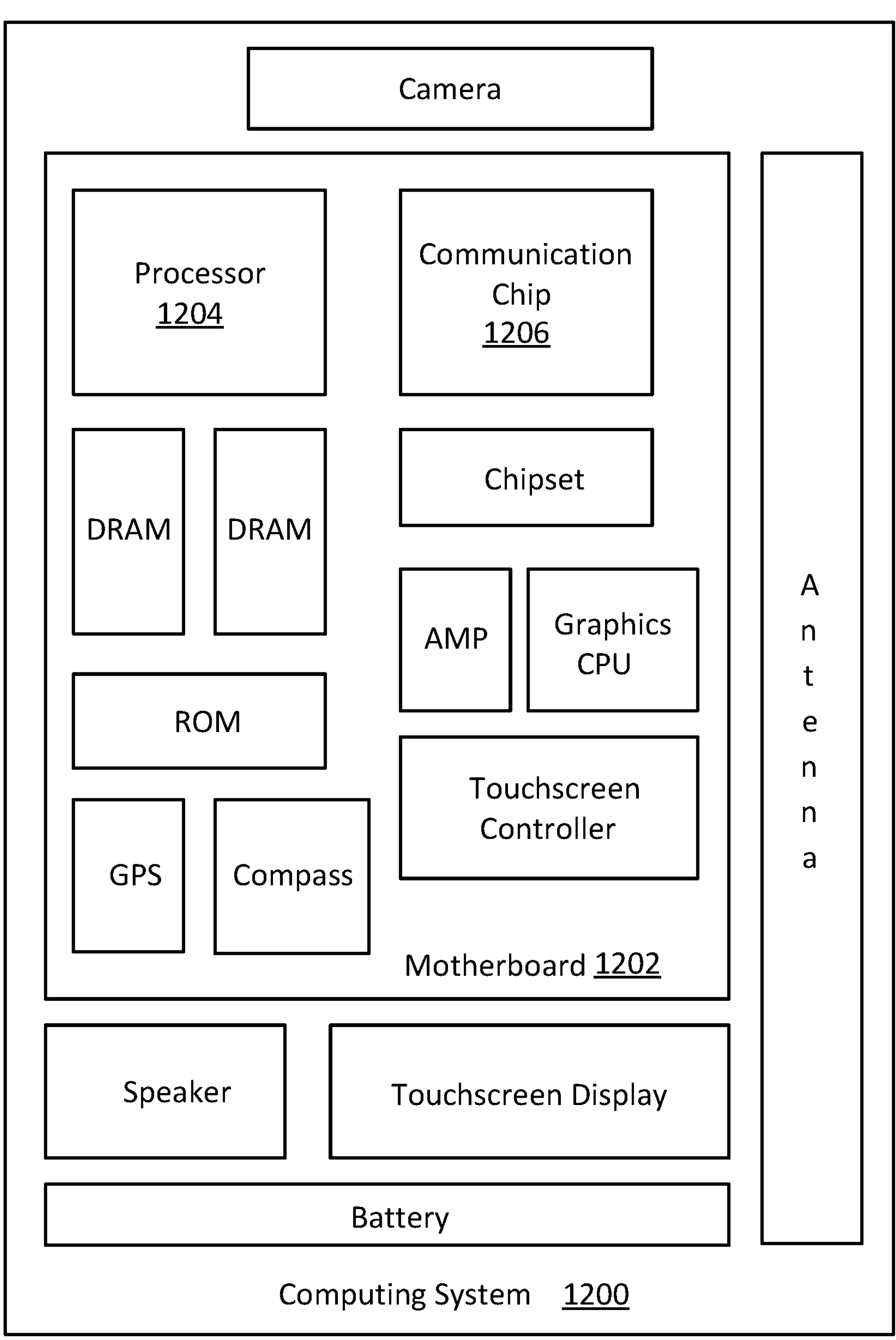
FIG. 12 illustrates a computing system including one or more integrated circuits, as variously described herein, in accordance with an embodiment of the present disclosure.

FIG. 12 is an example computing system implemented with one or more of the integrated circuit structures as disclosed herein, in accordance with some embodiments of the present disclosure. As can be seen, the computing system 1200 houses a motherboard 1202. The motherboard 1202 may include a number of components, including, but not limited to, a processor 1204 and at least one communication chip 1206, each of which can be physically and electrically coupled to the motherboard 1202, or otherwise integrated therein. As will be appreciated, the motherboard 1202 may be, for example, any printed circuit board (PCB), whether a main board, a daughterboard mounted on a main board, or the only board of system 1200, etc.

Depending on its applications, computing system 1200 may include one or more other components that may or may not be physically and electrically coupled to the motherboard 1202. These other components may include, but are not limited to, volatile memory (e.g., DRAM), non-volatile memory (e.g., ROM), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Any of the components included in computing system 1200 may include one or more integrated circuit structures or devices configured in accordance with an example embodiment (e.g., a module including an integrated circuit on a substrate, the substrate having semiconductor devices and at least one gate cut having a polymer layer at the interface between the source/drain and gate cut). In some embodiments, multiple functions can be integrated into one or more chips (e.g., for instance, note that the communication chip 1206 can be part of or otherwise integrated into the processor 1204).

The communication chip 1206 enables wireless communications for the transfer of data to and from the computing system 1200. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1206 may implement any of a number of wireless standards or protocols, including, but not limited to, Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing system 1200 may include a plurality of communication chips 1206. For instance, a first communication chip 1206 may be dedicated to shorter range wireless communications such as Wi-Fi and Bluetooth and a second communication chip 1206 may be dedicated to longer range wireless communications such as GPS, EDGE, GPRS, CDMA, WiMAX, LTE, Ev-DO, and others.

The processor 1204 of the computing system 1200 includes an integrated circuit die packaged within the processor 1204. In some embodiments, the integrated circuit die of the processor includes onboard circuitry that is implemented with one or more semiconductor devices as variously described herein. The term "processor" may refer to any device or portion of a device that processes, for instance, electronic data from registers and/or memory to transform that electronic data into other electronic data that may be stored in registers and/or memory.

The communication chip 1206 also may include an integrated circuit die packaged within the communication chip 1206. In accordance with some such example embodiments, the integrated circuit die of the communication chip includes one or more semiconductor devices as variously described herein. As will be appreciated in light of this disclosure, note that multi-standard wireless capability may be integrated directly into the processor 1204 (e.g., where functionality of any chips 1206 is integrated into processor 1204, rather than having separate communication chips). Further note that processor 1204 may be a chip set having such wireless capability. In short, any number of processor 1204 and/or communication chips 1206 can be used. Likewise, any one chip or chip set can have multiple functions integrated therein.

In various implementations, the computing system 1200 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, a digital video recorder, or any other electronic device that processes data or employs one or more integrated circuit structures or devices formed using the disclosed techniques, as variously described herein.

It will be appreciated that in some embodiments, the various components of the computing system 1200 may be combined or integrated in a system-on-a-chip (SoC) architecture. In some embodiments, the components may be hardware components, firmware components, software components or any suitable combination of hardware, firmware or software.

Further Example Embodiments

The following examples pertain to further embodiments, from which numerous permutations and configurations will be apparent.

Example 1 is an integrated circuit that includes a first semiconductor device having a first semiconductor region extending in a first direction from a first source region to a first drain region and a first gate structure extending in a second direction over the first semiconductor region, a second semiconductor device having a second semiconductor region extending in the first direction from a second source region to a second drain region and a second gate structure extending in the second direction over the second semiconductor region, and a gate cut between and separating the first gate structure and the second gate structure. The gate cut includes a dielectric material on a layer comprising polymer material. The layer comprising polymer material is along at least a portion of a sidewall of the gate cut.

Example 2 includes the integrated circuit of Example 1, wherein the polymer material directly contacts the first gate structure and the second gate structure.

Example 3 includes the integrated circuit of Example 1 or 2, wherein the polymer material comprises boron and oxygen or comprises boron and nitrogen.

Example 4 includes the integrated circuit of any one of Examples 1-3, wherein the layer comprising polymer material has a thickness between about 1 nm and about 3 nm.

Example 5 includes the integrated circuit of any one of Examples 1-4, wherein a portion of the polymer material contacts at least one of the first source region, the first drain region, the second source region, and the second drain region.

Example 6 includes the integrated circuit of any one of Examples 1-5, wherein the first semiconductor region comprises a plurality of first semiconductor nanoribbons and the second semiconductor region comprises a plurality of second semiconductor nanoribbons.

Example 7 includes the integrated circuit of Example 6, wherein the plurality of first semiconductor nanoribbons and the plurality of second semiconductor nanoribbons comprise germanium, silicon, or a combination thereof.

Example 8 includes the integrated circuit of any one of Examples 1-7, wherein the first gate structure includes a first gate dielectric around the first semiconductor region, and the second gate structure includes a second gate dielectric around the second semiconductor region.

Example 9 includes the integrated circuit of Example 8, wherein the first gate dielectric and the second gate dielectric are not present on any sidewall of the gate cut.

Example 10 includes the integrated circuit of any one of Examples 1-9, wherein the dielectric material of the gate cut comprises silicon and oxygen.

Example 11 is a printed circuit board comprising the integrated circuit of any one of Examples 1-10.

Example 12 is an electronic device that includes a chip package comprising one or more dies. At least one of the one or more dies includes a first semiconductor device having a first semiconductor region extending in a first direction from a first source region to a first drain region and a first gate structure extending in a second direction over the first semiconductor region, a second semiconductor device having a second semiconductor region extending in the first direction from a second source region to a second drain region and a second gate structure extending in the second direction over the second semiconductor region, and a gate cut between and separating the first gate structure and the second gate structure. The gate cut includes a polymer layer at edges of the gate cut and a dielectric material on the polymer layer.

Example 13 includes the electronic device of Example 12, wherein the polymer layer directly contacts the first gate structure and the second gate structure.

Example 14 includes the electronic device of Example 12 or 13, wherein the polymer layer comprises boron and oxygen or comprises boron and nitrogen.

Example 15 includes the electronic device of any one of Examples 12-14, wherein the polymer layer has a thickness between about 1 nm and about 3 nm.

Example 16 includes the electronic device of any one of Examples 12-15, wherein a portion of the polymer layer contacts at least one of the first source region, the first drain region, the second source region, and the second drain region.

Example 17 includes the electronic device of any one of Examples 12-16, wherein the first semiconductor region comprises a plurality of first semiconductor nanoribbons and the second semiconductor region comprises a plurality of second semiconductor nanoribbons.

Example 18 includes the electronic device of Example 17, wherein the plurality of first semiconductor nanoribbons and the plurality of second semiconductor nanoribbons comprise germanium, silicon, or a combination thereof.

Example 19 includes the electronic device of any one of Examples 12-18, wherein the first gate structure includes a first gate dielectric around the first semiconductor region, and the second gate structure includes a second gate dielectric around the second semiconductor region.

Example 20 includes the electronic device of Example 19, wherein the first gate dielectric and the second gate dielectric are not present on any sidewall of the gate cut.

Example 21 includes the electronic device of any one of Examples 12-20, wherein the dielectric material comprises silicon and oxygen.

Example 22 includes the electronic device of any one of Examples 12-21, further comprising a printed circuit board, wherein the chip package is coupled to the printed circuit board.

Example 23 is a method of forming an integrated circuit that includes forming a first fin comprising first semiconductor material and a second fin comprising second semiconductor material, the first and second fins extending above a substrate and each extending in a first direction; forming a gate structure extending over the first semiconductor material and the second semiconductor material in a second direction different from the first direction; forming a recess through the gate structure between the first fin and the second fin, wherein forming the recess comprises forming a polymer layer on sidewalls of the recess; exposing the polymer layer to oxygen for a given period of time to harden the polymer layer; and forming a dielectric material within a remaining volume of the recess.

Example 24 includes the method of Example 23, wherein forming the recess further comprises forming an opening through a hard mask layer over the gate structure; forming a passivation layer within the opening; etching through at least the passivation layer at a bottom of the opening; and etching through a portion of the gate structure.

Example 25 includes the method of Example 23 or 24, wherein exposing the polymer layer to oxygen comprises exposing the polymer layer to oxygen for at least 2 hours.

Example 26 includes the method of any one of Examples 23-25, wherein exposing the polymer layer to oxygen comprises exposing the polymer layer to an environment that includes both nitrogen and air.

Example 27 includes the method of any one of Examples 23-26, further comprising forming source and drain regions at ends of the first semiconductor material and the second semiconductor material.

Example 28 includes the method of Example 27, wherein forming the polymer layer further comprises forming the polymer layer on at least a portion of one or more of the source and drain regions.

Example 29 is an integrated circuit that includes one or more semiconductor regions extending in a first direction between corresponding source or drain regions, a gate structure extending in a second direction over the one or more semiconductor regions, and a gate cut extending in a third direction through an entire thickness of the gate structure. The gate cut includes a polymer layer at edges of the gate cut and a dielectric material on the polymer layer.

Example 30 includes the integrated circuit of Example 29, wherein the polymer layer directly contacts the gate structure.

Example 31 includes the integrated circuit of Example 29 or 30, wherein the polymer layer comprises boron and oxygen or comprises boron and nitrogen.

Example 32 includes the integrated circuit of any one of Examples 29-31, wherein the polymer layer has a thickness between about 1 nm and about 3 nm.

Example 33 includes the integrated circuit of any one of Examples 29-32, wherein a portion of the polymer layer contacts at least one of the corresponding source or drain regions.

Example 34 includes the integrated circuit of any one of Examples 29-33, wherein the one or more semiconductor regions comprises a plurality of semiconductor nanoribbons.

Example 35 includes the integrated circuit of Example 34, wherein the plurality of semiconductor nanoribbons comprise germanium, silicon, or a combination thereof.

Example 36 includes the integrated circuit of any one of Examples 29-35, wherein the gate structure includes a gate dielectric around the one or more semiconductor regions.

Example 37 includes the integrated circuit of Example 36, wherein the gate dielectric is not present on any sidewall of the gate cut.

Example 38 includes the integrated circuit of any one of Examples 29-37, wherein the dielectric material comprises silicon and oxygen.

Example 39 is a printed circuit board that includes the integrated circuit of any one of Examples 29-38.

The foregoing description of the embodiments of the disclosure has been presented for the purposes of illustration and description. It is not intended to be exhaustive or to limit the disclosure to the precise forms disclosed. Many modifications and variations are possible in light of this disclosure. It is intended that the scope of the disclosure be limited not by this detailed description, but rather by the claims appended hereto.

What is claimed is:

1. An integrated circuit comprising:

a first semiconductor device having a first semiconductor region extending in a first direction from a first source or drain region to a second source or drain region, and a first gate structure extending in a second direction over the first semiconductor region;

a second semiconductor device having a second semiconductor region extending in the first direction from a third source or drain region to a fourth source or drain region, and a second gate structure extending in the second direction over the second semiconductor region; and a gate cut extending in the first direction between and separating the first gate structure and the second gate structure, and extending in the first direction between and separating the first source or drain region from the third source or drain region, the gate cut comprising a dielectric material on a layer comprising polymer material, wherein the layer comprising polymer material is along at least a portion of a sidewall of the gate cut, and wherein the layer comprising polymer material is directly on at least a portion of the first source or drain region.

2. The integrated circuit of claim 1, wherein the layer comprising polymer material directly contacts the first gate structure and the second gate structure.

3. The integrated circuit of claim 1, wherein the polymer material comprises boron and oxygen or comprises boron and nitrogen.

4. The integrated circuit of claim 1, wherein the layer comprising polymer material has a thickness between about 1 nm and about 3 nm.

5. The integrated circuit of claim 1, wherein the layer comprising polymer material is directly on at least a portion of the third source or drain region.

6. The integrated circuit of claim 1, wherein the first gate structure includes a first gate dielectric around the first semiconductor region, and the second gate structure includes a second gate dielectric around the second semiconductor region.

7. The integrated circuit of claim 6, wherein the first gate dielectric and the second gate dielectric are not present on any sidewall of the gate cut.

8. A printed circuit board comprising the integrated circuit of claim 1.

9. An electronic device, comprising:

a chip package comprising one or more dies, at least one of the one or more dies comprising a first semiconductor device having a first semiconductor region extending in a first direction from a first source or drain region to a second source or drain region, and a first gate structure extending in a second direction over the first semiconductor region;

a second semiconductor device having a second semiconductor region extending in the first direction from a third source region to a fourth source or drain region, and a second gate structure extending in the second direction over the second semiconductor region; and a cut structure extending in the first direction between and separating the first source or drain region and the third source or drain region, the cut structure comprising a polymer layer at edges of the cut structure and a dielectric material on the polymer layer, such that the polymer layer is directly on at least a portion of the first source or drain region.

10. The electronic device of claim 9, wherein the cut structure further extends in the first direction between the first gate structure and the second gate structure, and the polymer layer directly contacts the first gate structure and the second gate structure.

11. The electronic device of claim 9, wherein the polymer layer comprises boron and oxygen or comprises boron and nitrogen.

12. The electronic device of claim 9, wherein the polymer layer is directly on at least a portion of the third source or drain region.

13. The electronic device of claim 9, wherein the first gate structure includes a first gate dielectric around the first semiconductor region, and the second gate structure includes a second gate dielectric around the second semiconductor region, and wherein the first gate dielectric and the second gate dielectric are not present on any sidewall of the cut structure.

14. The electronic device of claim 9, further comprising a printed circuit board, wherein the chip package is coupled to the printed circuit board.

15. An integrated circuit comprising:

one or more semiconductor regions extending in a first direction between corresponding source or drain regions;

a gate structure extending in a second direction over the one or more semiconductor regions; and a gate cut extending in a third direction through an entire thickness of the gate structure, the gate cut comprising a polymer layer at edges of the gate cut and a dielectric material on the polymer layer, wherein the gate cut further extends in the first direction adjacent to at least one of the source or drain regions, and wherein the polymer layer is directly on at least a portion of the at least one of the source or drain regions.

16. The integrated circuit of claim 15, wherein the polymer layer directly contacts the gate structure.

17. The integrated circuit of claim 15, wherein the polymer layer comprises boron and oxygen or comprises boron and nitrogen.

18. The integrated circuit of claim 15, wherein the polymer is directly on at least one other source or drain region of the corresponding source or drain regions.

19. The integrated circuit of claim 15, wherein the gate structure includes a gate dielectric around the one or more semiconductor regions, and wherein the gate dielectric is not present on any sidewall of the gate cut.

20. A printed circuit board comprising the integrated circuit of claim 15.

* * * * *